(12) United States Patent
Ohnuma

(10) Patent No.: US 7,700,947 B2
(45) Date of Patent: Apr. 20, 2010

(54) SEMICONDUCTOR DEVICE

(75) Inventor: Hideto Ohnuma, Kanagawa (JP)

(73) Assignee: Semiconductor Energy Laboratory Co., Ltd., Kanagawa-Ken (JP)

(*) Notice: Subject to any disclaimer, the term of this patent is extended or adjusted under 35 U.S.C. 154(b) by 42 days.

(21) Appl. No.: 11/086,366

(22) Filed: Mar. 23, 2005

(65) Prior Publication Data

US 2005/0184290 A1  Aug. 25, 2005

Related U.S. Application Data

(62) Division of application No. 09/566,985, filed on May 9, 2000, now Pat. No. 6,878,968.

(30) Foreign Application Priority Data

May 10, 1999  (JP) ............................. 11-129179

(51) Int. Cl.
  *H01L 29/04* (2006.01)
(52) U.S. Cl. ............... 257/49; 438/488; 257/E21.411; 257/E21.413
(58) Field of Classification Search ............... 257/49, 257/E21.411, E21.413; 136/258; 438/97, 438/488
  See application file for complete search history.

(56) References Cited

U.S. PATENT DOCUMENTS 4,769,686 A *  9/1988  Horiuchi et al. ............. 257/373
5,147,826 A *  9/1992  Liu et al. ..................... 438/486
5,242,855 A     9/1993  Oguro
5,580,792 A * 12/1996  Zhang et al. ................ 438/166
5,589,694 A * 12/1996  Takayama et al. ............. 257/67

(Continued)

FOREIGN PATENT DOCUMENTS

JP           06-130415           5/1994

(Continued)

OTHER PUBLICATIONS

Richard B. Fair, "Diffusion and Ion Implantation in Silicon", in "Semiconductor Materials and Process Technology Handbook", Ed. By G.E. McGuire, published by William Andrew Publishing / Noyes (1988), in particular, pp. 528-535.

(Continued)

*Primary Examiner*—W. David Coleman
*Assistant Examiner*—Sonya D McCall-Shepard
(74) *Attorney, Agent, or Firm*—Nixon Peabody LLP; Jeffrey L. Costellia

(57) ABSTRACT

A metallic element is effectively removed from a semiconductor film crystallized by using the metallic element. The concentration distribution of phosphorous or antimony in the depth direction of at least one of a source and a drain of a TFT semiconductor film has: a region in which the concentration is $1 \times 10^{20}$ atoms/cm$^3$ or less is 5 nm or greater in thickness, and $5 \times 10^{19}$ atoms/cm$^3$ or greater in the maximum value. By creating this concentration distribution, and by thermal annealing at about between 500 and 650° C., the metallic element within a channel forming region diffuses to the source or the drain, and at the same time as gettering is accomplished, the region in which the concentration is $1 \times 10^{20}$ atoms/cm$^3$ or less is made into a nucleus and the source region/drain region is recrystallized.

24 Claims, 22 Drawing Sheets

THE CONCENTRATION DISTRIBUTION
OF THE GROUP 15 ELEMENT

U.S. PATENT DOCUMENTS

| | | | |
|---|---|---|---|
| 5,594,569 A | 1/1997 | Konuma et al. | |
| 5,608,232 A | 3/1997 | Yamazaki et al. | |
| 5,639,698 A | 6/1997 | Yamazaki et al. | |
| 5,700,333 A * | 12/1997 | Yamazaki et al. | 136/258 |
| 5,789,283 A | 8/1998 | Park | |
| 5,843,225 A | 12/1998 | Takayama et al. | |
| 5,879,977 A | 3/1999 | Zhang et al. | |
| 5,895,933 A | 4/1999 | Zhang et al. | |
| 5,897,347 A | 4/1999 | Yamazaki et al. | |
| 5,915,174 A | 6/1999 | Yamazaki et al. | |
| 5,956,579 A | 9/1999 | Yamazaki et al. | |
| 5,961,743 A | 10/1999 | Yamazaki et al. | |
| 6,013,930 A | 1/2000 | Yamazaki et al. | |
| 6,066,518 A | 5/2000 | Yamazaki | |
| 6,077,731 A | 6/2000 | Yamazaki et al. | |
| 6,162,704 A | 12/2000 | Yamazaki et al. | |
| 6,165,824 A | 12/2000 | Takano et al. | |
| 6,251,712 B1 | 6/2001 | Tanaka et al. | |
| 6,258,644 B1 * | 7/2001 | Rodder et al. | 438/199 |
| 6,278,131 B1 | 8/2001 | Yamazaki et al. | |
| 6,353,244 B1 | 3/2002 | Yamazaki et al. | |
| 6,518,102 B1 | 2/2003 | Tanaka et al. | |
| 6,576,924 B1 | 6/2003 | Yamazaki et al. | |
| 6,590,229 B1 | 7/2003 | Yamazaki et al. | |
| 6,593,592 B1 | 7/2003 | Yamazaki et al. | |
| 6,943,369 B2 * | 9/2005 | Hayashi | 257/40 |

FOREIGN PATENT DOCUMENTS

| | | | |
|---|---|---|---|
| JP | 06130415 A * | 5/1994 | |
| JP | 06-232059 | 8/1994 | |
| JP | 06-244103 | 9/1994 | |
| JP | 06-244104 | 9/1994 | |
| JP | 07-077705 | 3/1995 | |
| JP | 07-321339 | 12/1995 | |
| JP | 10-254097 | 9/1998 | |
| JP | 10-256557 | 9/1998 | |
| JP | 10256557 A * | 9/1998 | |
| JP | 10 270363 | 10/1998 | |
| JP | 11-054760 | 2/1999 | |
| JP | 11-133463 | 5/1999 | |
| JP | 11-338786 | 12/1999 | |
| JP | 11-341272 | 12/1999 | |

OTHER PUBLICATIONS

Furue et al., "Characteristics and Driving Scheme of Polymer-Stabilized Monstable FLCD Exhibiting Fast Response Time and High Contrast Ratio with Gray-Scale Capability", 1998, pp. 782-785, SID 98 Digest.

Yoshida et al., "A Full-Color Thresholdless Antiferroelectric LCD Exhibiting Wide Viewing Angle with Fast Response Time", 1997, pp. 841-844, SID 97 Digest.

Inui et al., "Thresholdless Antifamelectricity in Liquid Crystals and its Application to Displays", 1996, pp. 671-673, J. Mater. Chem., 6(4).

Chuo, N.J., van der Meulen, Y.J., Hammer, R., and Cahill, J., Applied Physics Letters 24 (1974), 200.

Schwarz, S.A., Barton, R.W., Ho, C.P., and Helms, C.R., J. Electrochem. Soc. 128 (1981), 1101.

Ishiyama, T., Matsumoto, S., Yachi, T., and Fichtner, W., "A New Model for Dopant Redistribution in a Power SOI Structure", in Power Semiconductor Devices and ICs, 1999; ISPS Proc. (the 11$^{th}$ Int. Symp.) pp. 217-220 (May 26-28, 1999).

Specification and Drawings for Application U.S. Appl. No. 09/451,665, "Semiconductor Device and Manufacturing Method Thereof", Filing Date: Nov. 30, 1999, Inventors: Shunpei Yamazaki et al.

Chuo, N.J., van der Meulen, Y.J., Hammer, R., and Cahill, J.; "Auger and Ellipsometric Study of Phosphorus Segregation in Oxidized Degenerate Silicon"; Appl. Phys. Lett. (Applied Physics Letters), vol. 24, (1974), pp. 200-202.

Schwarz, S.A., Barton, R.W., Ho, C.P., and Helms, C.R.; "Studies of Phosphorus Pile-Up At the Si-SiO2 Interface Using Auger Sputter Profiling", J. Electrochem Soc. (Journal of the Electrochemical Society), vol. 128, (1981), pp. 1101-1105.

* cited by examiner

AMORPHOUS SILICON FILM
MASK
BASE FILM
SUBSTRATE
ELEMENT FOR PROMOTING CRYSTALLIZATION FILM

CRYSTALLINE SILICON FILM

GROUP 15 ELEMENT ADDED REGION
MASK
NON-ADDED REGION
ELEMENT FORMING REGION

ISLAND-LIKE SEMICONDUCTOR REGION
n-TYPE IMPURITY REGION 208-211 n-TYPE LOW CONCENTRATION IMPURITY REGION 212-215 ISLAND LIKE SEMICONDUCTOR FILM 219-221 GATE WIRING 222-227 n-TYPE LOW CONCENTRATION IMPURITY REGION 233-241 n-TYPE HIGH CONCENTRATION IMPURITY REGION

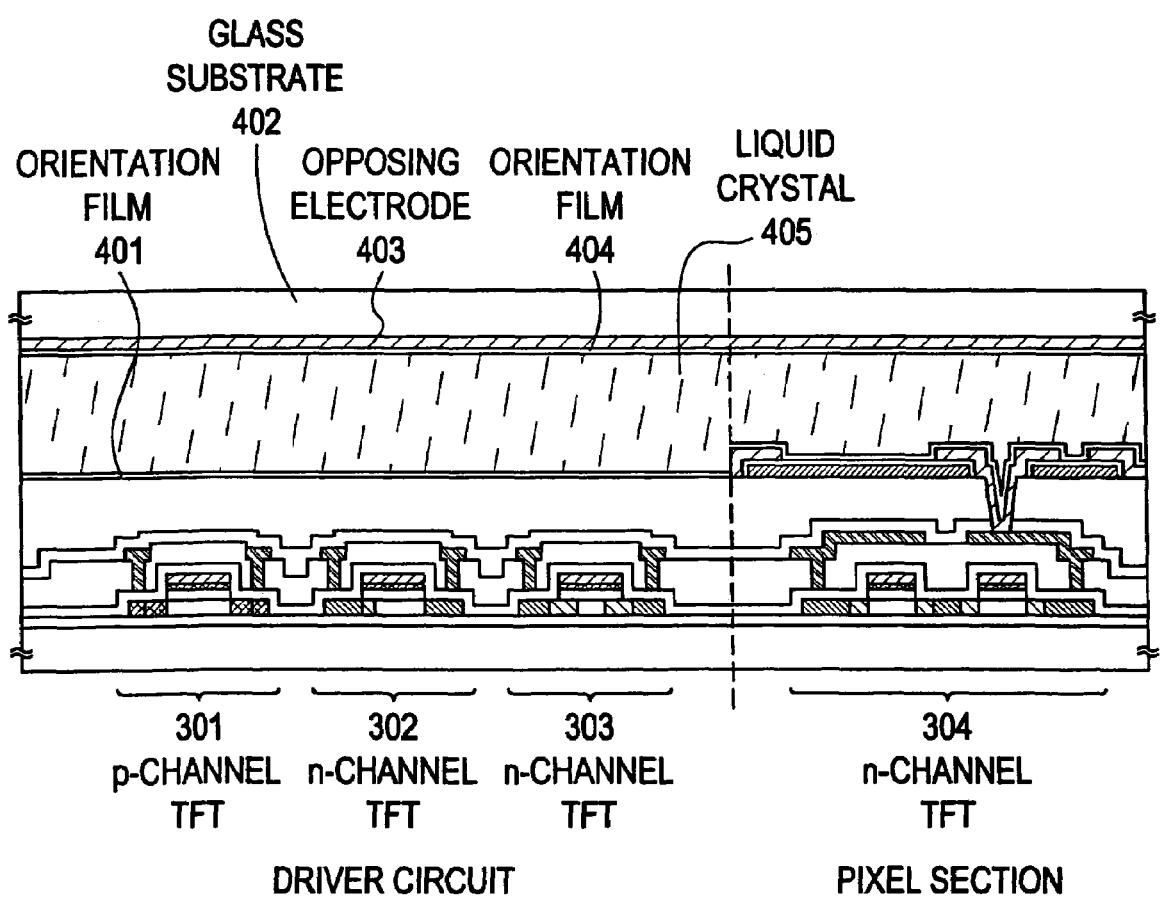

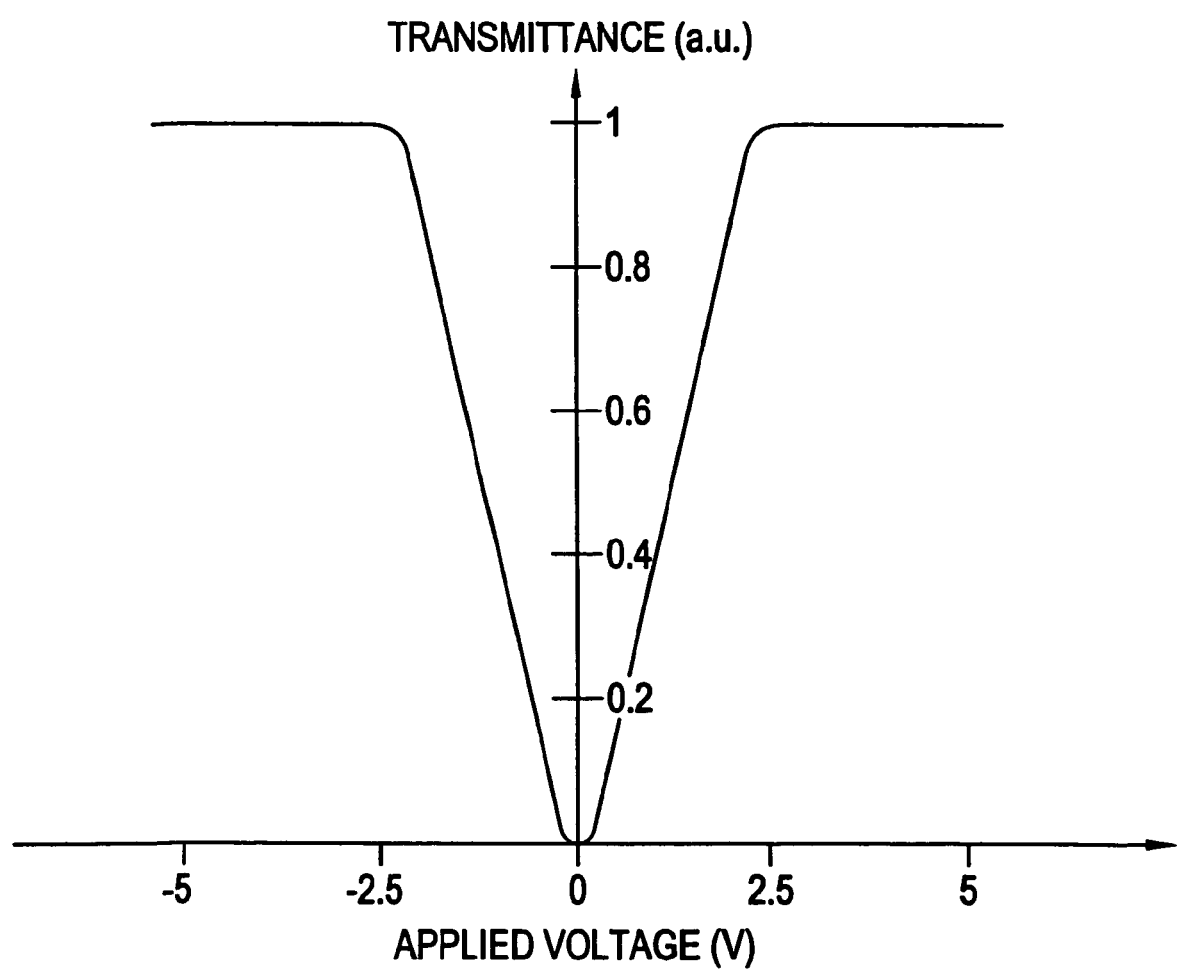

SEMICONDUCTOR DEVICE

BACKGROUND OF THE INVENTION

1. Field of the Invention

The present invention relates to a method of manufacturing a semiconductor device using a crystalline semiconductor film. Note that the semiconductor device of the present invention includes as its category not only an element such as a thin film transistor or a MOS transistor, but an electronic equipment having a semiconductor circuit structured by these insulated gate type semiconductor elements, and electronic equipment such as a personal computer or a digital camera equipped with an electro-optical display device formed of an active matrix substrate (typically a liquid crystal display device or an EL display device).

2. Description of the Related Art

A thin film transistor (TFT) is presently known as a semiconductor element using a semiconductor film. A TFT is used as a switching element of a pixel section of an active matrix type liquid crystal display device. In recent years, the manufacture of TFTs using a polycrystalline silicon film, which has a higher mobility than that of an amorphous silicon film, in a semiconductor layer has become possible, and the change to high mobility TFTs is proceeding apace. As a result, it has become possible to manufacture not only the pixel section, but also driver circuits on the same substrate.

To form a polycrystalline silicon film conventionally, a method of direct film deposition of a polycrystalline silicon film by CVD after raising the substrate temperature; a method of crystallizing an amorphous silicon film, deposited by CVD or sputtering, in the solid state by heat treatment at 600 to 1100° C. for between 20 and 48 hours; and a method of irradiating an excimer laser, melting, and then recrystallizing an amorphous silicon film are known. The crystal grain size is larger, and the manufactured semiconductor element characteristics are better, in the polycrystalline silicon film in which the amorphous silicon film is crystallized, compared with the polycrystalline silicon film directly deposited on the substrate.

When crystallization is performed by heat treatment, if a glass substrate is used, then the upper limit of the process temperature becomes on the order of 600° C., and a long amount of time is required for the crystallization process. Further, 600° C. is near the minimum temperature at which silicon is crystallized, and if the temperature is 500° C. or less, then it is impossible to crystallize in an industrially reasonable amount of time.

To shorten the crystallization time, a quartz substrate having a high distortion point is used. The heat treatment temperature may be raised to about 1000° C., but the quartz substrate is extremely expensive compared to the glass substrate, and it is difficult to make it into a large surface area. On the other hand, the glass substrate possesses the advantages of being low cost and easily made into a large surface area, but has the disadvantage of low heat resistance. Corning 7059 glass, widely used in active matrix type liquid crystal display devices, has a glass distortion point of 593° C., and there arise fears that the substrate is warped or bent by heating it for several hours at a temperature of 600° C. or more. Due to this, in order to be able to use a glass substrate such as Corning 7059 glass, the crystallization process must be made at a lower temperature and for a shorter time.

A crystallization technique using an excimer laser is one technique in which the process can be made at a lower temperature and in a shorter time. Excimer laser light can provide a semiconductor film with an amount of energy equivalent to thermal annealing at approximately 1000° C. in a short amount of time, while imparting almost no thermal influence on the substrate, and a high crystallinity semiconductor film can be formed. However, an excimer laser has a dispersed energy distribution on the irradiation surface, and it is difficult to make the crystallinity of the crystalline semiconductor film obtained uniform, and therefore it is difficult to make the characteristics uniform for each TFT element.

The applicant of the present invention wholeheartedly researched a technique for making the crystallization temperature lower while using heat treatment, and the fruits of this research are shown in Japanese Patent Application Laid-open No. Hei 6-232059 and Japanese Patent Application Laid-open No. Hei 7-321339, or U.S. Pat. Nos. 5,843,225 and 5,895,933. The above published techniques are ones in which a crystalline silicon film is obtained by performing thermal annealing in a state where a small amount of a metallic element for promoting crystallization is added into an amorphous silicon film. It is possible to form crystalline silicon by thermal annealing at 450 to 600° C. for between 4 and 12 hours with this crystallization technique.

However, there is a problem with this crystallization technique in that the metallic element used for promoting crystallization remains in the crystalline silicon film. The metallic element harms the semiconductor characteristics of the silicon film, and therefore causes damage to the stability and the reliability of the TFT characteristics.

In order to resolve this problem, the inventors of the present invention developed a technique (gettering technique) of removing the crystallization promoting element from the crystalline silicon film, and disclose it in Japanese Patent Application Laid-open No. Hei 10-270363. This technique is one of selectively adding phosphorous into the crystalline silicon film and then performing thermal annealing. By thermal annealing, the nickel in the regions not added with phosphorous diffuses to the phosphorous added regions, and is captured therein. As a result, the metallic element concentration in the regions not added with phosphorous is reduced. The thermal annealing temperature can be set to 600° C. or less, a temperature which the glass substrate can withstand. There arises a disadvantage, however, that ten and few hours are required for the process. Furthermore, in order to form the phosphorous added regions, the region in which it is possible to form the element is limited, and this is a factor which hinders high integration.

SUMMARY OF THE INVENTION

An object of the present invention is to solve the above-mentioned problem and to provide a technique for realizing high efficiency removal of a metallic element, and further, high integration, in a technique of forming a crystalline silicon film using the metallic element.

In order to eliminate the above problems, according to the present invention, after performing crystallization of a semiconductor film using a metallic element for promoting crystallization, a periodic table group 15 element, specifically phosphorous or antimony, is selectively added into the crystallized semiconductor film to perform thermal annealing, then the metallic element contained within regions not added with the group 15 element is diffused into the regions added with the group 15 element, and is captured (gettered).

The further apart that the region from which the metallic element must be reduced (region to be gettered), and the region added with the group 15 element and which absorbs and captures the metallic element (gettering region), are located, the longer that the metallic element diffusion distance becomes, and consequently the longer the amount of time required for the removal. Therefore, one characteristic of the present invention is that the gettering region is formed as close as possible to the region to be gettered.

The semiconductor crystallized by using the metallic element for promoting crystallization in the present invention is a semiconductor having amorphous portions. The semiconductor is, specifically, a semiconductor having silicon as its principal constituent, a semiconductor having germanium as its principal constituent, or a compound semiconductor of silicon and germanium. The crystallinity of the semiconductor is amorphous or microcrystalline. M Microcrystallinity is a compound state of microscrystals and amorphousness containing crystal grains with a size of from several nanometers to several tens of nanometers. Further, the semiconductor film may be deposited with a thickness of from 10 to 150 nm, and it may be deposited by a chemical vapor phase method such as plasma CVD, reduced pressure CVD, or by a physical vapor phase method such as sputtering.

The metallic element for promoting crystallization indicates an element that has a catalytic action of promoting crystallization, especially for silicon, one element or plural kinds of elements selected from the group consisting of Ni, Fe, Co, Ru, Rh, Pd, Os, Ir, Pt, Cu, and Au can be used. Ni has the highest effect to promote crystallization.

A method of doping the metallic element into the semiconductor film, such as ion doping, ion injection, or diffusion, can be used to introduce the metallic element for promoting crystallization into the semiconductor film. Or a film containing the metallic element may be deposited on the top surface or the bottom surface of the semiconductor film. CVD, sputtering, evaporation, or an application method using a device such as a spinner may be used to form the film containing the metallic element. The above film containing the metallic element may be formed from a film of the metallic element, from a metal compound film, typically a silicide film. For example, when using Ni as the metallic element, a nickel film or a nickel silicide film may be deposited.

Further, when using an application method, a solution with nickel salt such as nickel bromide, nickel acetate, nickel oxalate, nickel carbonate, nickel chloride, nickel iodide, nickel nitrate, or nickel sulfate as a solute, and water, alcohol, acid, or ammonia as a solvent; or a solution with nickel as a solute and benzine, toluene, xylene, carbon tetrachloride, chloroform, or ether as a solvent, can be used. Alternately, a material such as an emulsion in which nickel is dispersed throughout a solvent, even if nickel is not completely dissolved, may be used.

Further, a method of forming an oxide film containing nickel in which either nickel or a nickel compound is dispersed in a solution used for forming an oxide film is acceptable. OCD (Ohka Diffusion Source), by Tokyo Ohka Kogyo K. K., can be used as this type of solution. A silicon oxide film can be easily formed when OCD solution is used to apply to the formation surface and then to fire at approximately 200° C. Other crystallization promoting metallic elements can be handled similarly.

The deposition of the film containing the metallic element and the deposition of the semiconductor film may be performed either order here. If the semiconductor film is deposited first, then the film containing the metallic element for promoting crystallization is formed on top of the semiconductor film. If the semiconductor film is formed afterward, then the film containing the metallic element for promoting crystallization is formed under the semiconductor film.

The film containing the metallic element is not only formed contacting the semiconductor film, but an oxide film or a natural oxide film with a thickness of from several nanometers to several tens of nanometers may exist between the semiconductor film and the film containing the metallic element. In the semiconductor film crystallization process stated below, provided that the metallic element can diffuse from the film containing the metallic element to within the semiconductor film, an oxide film or a natural oxide film may have a thickness of from several nanometers to several tens of nanometers, there causes no problem in crystallization.

In crystallizing the semiconductor film containing amorphous portions, the semiconductor film is heated by thermal annealing or light annealing, and the metallic element is moved (diffused) within the semiconductor film while reacting with the silicon or germanium. While the metallic element is moving, it exerts a catalytic action on the molecular bonds in the amorphous state, crystallizing the semiconductor film. The applicant of the present invention discloses information regarding the action of the metallic element in Japanese Patent Application Laid-open No. Hei 6-244103 and in Japanese Patent Application Laid-open No. Hei 6-244104, and U.S. Pat. Nos. 5,639,698 and 5,879,977. The silicon in contact with the metallic element combines with the metallic element, forming a silicide. It is understood that then the silicide and the amorphous state silicon combination react, and crystallization progresses. This is because the interatomic distance between the crystallization promoting metallic element and the silicon is extremely close to the interatomic distance of single crystal silicon. The Ni—Si interatomic distance is the closest to the single crystal Si—Si interatomic distance, shorter by approximately 0.6%.

The following equation can be used to represent a model of the reaction that crystallizes the amorphous silicon film using Ni as the crystallization promoting metallic element:

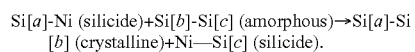

$$Si[a]\text{-}Ni \text{ (silicide)} + Si[b]\text{-}Si[c] \text{ (amorphous)} \rightarrow Si[a]\text{-}Si[b] \text{ (crystalline)} + Ni\text{—}Si[c] \text{ (silicide)}.$$

In the above reaction equation, the indices [a], [b], and [c] represent Si atomic locations.

The above reaction equation shows that Ni atoms in the silicide replace Si[b] atoms in the silicon of the amorphous portion, so the Si[a]-Si[b] interatomic distance becomes almost the same as in a single crystal. In addition, it shows that Ni continues to diffuse within the semiconductor film, causing crystal growth.

Thermal annealing may be performed in a furnace at 450° C. or above for imparting the energy to advance the crystallization reaction. The upper limit of the thermal annealing temperature is 650° C. If 650° C. is exceeded, then the amorphous silicon film crystallization will advance even in the areas which do not react with the metallic element for promoting crystallization, and the crystal grains cannot become large because the metallic element cannot diffuse into those areas, and further, the grain sizes are also fluctuated.

Further, light annealing in which infrared light is irradiated can be used as a method of solid phase growth, similar to heat treatment in a furnace. RTA, in which infrared light that has peaks in a wavelength of from 0.6 to 4 μm, desirably between 0.8 and 1.4 μm, is irradiated for several tens to several hundreds of seconds, is known as the light annealing with infrared light. The absorption coefficient for infrared light is high, so the semiconductor film is heated to a temperature of from 800 to 1100° C. in a short time by irradiation of infrared light. However, the RTA irradiation time becomes long, and heat is easily absorbed by the substrate, it is necessary to be careful of the generation of the substrate warping in a case where a glass substrate is used.

The reaction equation showing the above crystallization model shows that at the time when the crystallization is completed, Ni is locally present at the end point (or at the tip of the crystal growth). In short, Ni is irregularly distributed in combination with Si within the film after-crystallization in a silicide state represented by $NiSi_x$. The existence of this silicide can be confirmed by etching the crystallized silicon film with FPM (an etchant of 50% HF and 50% $H_2O_2$ mixed 1::1) for approximately 30 seconds. Areas in which silicide is confirmed to be present by etching, become holes.

In order to remove (getter) the metallic element existing within the crystallized semiconductor film in the present invention, a periodic table group 15 element is selectively added into the semiconductor film and thermally annealed, thus reducing the concentration of the metallic element in the regions not added with the group 15 element. The annealing temperature is set from 500 to 850° C., preferably between 550 and 650° C., and the annealing time is set from 1 to 12 hours.

The region in which the metallic element for promoting crystallization is reduced (region to be gettered) contains at least a region which becomes a channel forming region. The switching characteristics and the mobility value vary greatly depending upon the characteristics of the channel forming region. If the metallic element for promoting crystallization remains as is in the channel forming region, then the semiconductor characteristics are damaged, and this becomes a cause of damage to the stability and the reliability of an element.

Moreover, in addition to the region which becomes the channel forming region, it is preferable to include a low concentration impurity region contacting the channel forming region in the region to be gettered. The low concentration impurity region is formed to reduce the leak current when a reverse bias voltage is applied, and to inhibit deterioration due to hot carriers. Therefore, it is possible to manufacture an element having stability and reliability with regard to the reduction in leak current by reducing the amount of metallic element for promoting crystallization which exists in the low concentration impurity region. Note that the low concentration impurity region is a region in which the impurity concentration which determines the conductivity of the source/drain is lower than that of the source region and the drain region. This impurity concentration is $1\times10^{16}$ to $1\times10^{19}$ atoms/cm$^3$.

The concentration of the group 15 element added into the gettering region is approximately 10 times the concentration of the metallic element for promoting crystallization which remains within the semiconductor film. If the metallic element concentration is on the order of from $10^{18}$ to $10^{20}$ atoms/cm$^3$, then crystallization can be performed with good reproducibility. The concentration of phosphorous or antimony in the gettering region may then be on the order of from $10^{19}$ to $10^{22}$ atoms/cm$^3$ because the amount of metallic element for promoting crystallization remains. Phosphorous (P) and antimony (As) are n-type impurities for imparting n-type conductivity to the silicon or germanium semiconductor, and because phosphorous or antimony is constrained in the gettering region in the above concentration range, the semiconductor gettering region added with phosphorous or antimony can be used as an n-type impurity region of the semiconductor element.

Thus the region added with phosphorous or antimony to capture the metallic element is included in the semiconductor film of the semiconductor element in the present invention. With this structure, at the same time as the gettering region nears the channel forming region, the region in which elements can be formed, get larger in the semiconductor film, and integration becomes easy.

For example, in an n-channel TFT, a region added with a group 15 element, which becomes a gettering region, is included in at least one of an n-type source region and drain region. Provided that the gettering region has at least the size of the region which becomes the source region, or the region which becomes the drain region, then metallic element within the channel forming region and in the low concentration impurity region can be sufficiently removed. Of course, the larger the gettering region, the lower the annealing temperature can be made, and the shorter the annealing time.

Vapor phase methods such as plasma doping which does not have mass separation, and ion injection which does have mass separation, can be given for the doping of phosphorous or antimony into the semiconductor film. When using this type of doping method, the crystallinity of the regions into which the element is added is damaged. As stated above, the region used in order to getter the metallic element is included in an n-type high concentration impurity region or a p-type high concentration impurity region formed in the semiconductor film of the semiconductor element, and therefore it is necessary to restore (recrystallize) the crystallinity of these regions. A process of restoring crystallinity in the present invention is combined with the thermal annealing process for gettering the metallic element, and therefore phosphorous or antimony is added so that the n-type impurity region can be recrystallized by thermal annealing at about between 500 and 650° C.

The higher the concentration of the added impurity becomes, the more the crystallinity is harmed, and the more difficult it becomes to recrystallize. Therefore, in the present invention, for recrystallization, the concentration distribution of phosphorous or antimony is regulated in the gettering region in the thickness direction of the semiconductor film. FIG. 1 is an example of the concentration profile of the group 15 element in the depth direction (concentration distribution in the depth direction) of the gettering region of the present invention. The vertical axis shows the concentration, and the horizontal axis shows the depth in the semiconductor film, with the surface of the semiconductor film taken as zero.

The maximum value of the group 15 element concentration is set at $5\times10^{19}$ atoms/cm$^3$ or greater, specifically in the range of $1\times10^{20}$ to $1\times10^{22}$ atoms/cm$^3$, so that the metallic element can be gettered and the region can function as a source or a drain. At the same time, the concentration is made to be $1\times10^{20}$ atoms/cm$^3$ or less over a distance of 5 nm or greater in the depth direction (the thickness from the interface with a base film), typically between 5 nm and 20 nm, for recrystallization. In other words, the thickness d of the layer having a concentration of $1\times10^{20}$ atoms/cm$^3$ or less is 5 nm or greater (the region shown by diagonal lines in FIG. 1), and typically may exist between 5 and 20 nm.

The semiconductor crystallinity is not greatly damaged in the area in which the group 15 element concentration is $1\times10^{20}$ atoms/cm$^3$ or less, and therefore this area is taken as a nucleus, and the entire gettering region can be recrystallized. Further, to make this area function as a crystal nucleus, the thickness d of the region is set at 5 nm or greater, between 5 nm and 20 nm.

In addition, by not only adding a group 15 element such as phosphorous, but also adding a periodic table group 13 element in the gettering region according to the present invention, it has been discovered that a greater gettering effect can be obtained than by just doping phosphorous or antimony. The inventors of the present invention disclosed this gettering technique in Japanese Patent Application Laid-open No. Hei 11-54760. The entire disclosure of this patent is incorporated herein by reference. By doping the group 13 element at a higher concentration than the group 15 element, a very good gettering effect can be obtained. However, if the group 13 element concentration is lower than the group 15 element concentration, then the metallic element could not be gettered. Further, the metallic element could not be gettered by using only the group 13 element. A semiconductor in which the group 13 element concentration is higher than that of the group 15 element is a semiconductor indicating p-type conductivity, and can be used as a p-type impurity region of a semiconductor element.

Therefore, at least one of a source region or a drain region of a p-channel TFT can contain a p-type impurity region for gettering the metallic element. The group 13 element used for forming the p-type source/drain is boron, and it has a good gettering effect.

The p-type impurity region used as the gettering region in the present invention is added with both phosphorous (or antimony) and boron, but the molecular weight of boron is less than that of silicon and germanium, and therefore it is considered that the crystallinity of the crystalized semiconductor film is not damaged very much by the doping of boron. Consequently, the boron concentration profile of the gettering region is made higher than that of the group 15 element so as to obtain a gettering effect. On the other hand, the group 15 element concentration profile is made to meet the conditions of the group 15 element concentration profile in the n-type impurity region explained using FIG. 1.

SIMS (secondary ion mass spectroscopy) may be used in measuring the concentration profiles of phosphorous, antimony, and boron. FIG. 2 shows phosphorous and boron concentration profiles measured by SIMS. FIG. 2 is one example of phosphorous and boron concentration profiles in a p-type silicon film to be used in a gettering region, and the silicon film thickness is approximately 50 nm. Phosphorous and boron were added by ion doping. Phosphine was used as the doping gas for phosphorous, and diborane was used for boron. Both gasses were diluted by hydrogen. The acceleration voltage was 10 keV for both phosphorous and boron, and the set dosage was $1.5 \times 10^{13}$ ions/cm$^2$ for phosphorous, and $7.8 \times 10^{14}$ ions/cm$^2$ for boron.

In the region which is not added with the group 15 element, the metallic element is removed by thermal annealing for gettering. For example, when nickel is used as the metallic element, the above stated FPM processing was performed after gettering. However, holes did not develop in the region in which the group 15 element was not added. Further, in SIMS measurements, the metallic element concentration can be reduced to $5 \times 10^{17}$ atoms/cm$^3$ or less, and in addition, to $2 \times 10^{17}$ atoms/cm$^3$ or less.

Note that at present, the minimum detection level of SIMS is on the order of $2 \times 10^{17}$ atoms/cm$^3$, and therefore lower concentration cannot be investigated. However, it is estimated that the metallic element for promoting crystallization is reduced to at least between $1 \times 10^{14}$ and $1 \times 10^{15}$ atoms/cm$^3$ by the gettering process shown in this specification. Thus the reliability of a TFT can be raised by structuring its channel forming region with the semiconductor in which the metallic element has been reduced.

On the other hand, the metallic element concentration in the n-type impurity region and the p-type impurity region which have gettered the metallic element becomes $1 \times 10^{18}$ atoms/cm$^3$ or greater, between $1 \times 10^{18}$ and $1 \times 10^{21}$ atoms/cm$^3$. The metallic concentration is, defined as the maximum value measured by SIMS.

For example, when Ni is the metallic element for promoting crystallization and an n-type impurity region added with phosphorous (P) in the gettering region is used, the nickel gettered in the n-type impurity region exists in a combined state such as $NiP_1$ or $NiP_2Ni_2$. This bonded state is extremely stable, and therefore even if the region which gettered the metallic element is included in the source region or in the drain region, there is almost no effect on the TFT operation.

In addition, crystallinity of the N-type or P-type regions which getter the metal element can be cured by thermal annealing at 500 to 650° C. since these regions are added with the group 15 and 13 elements in the above explained concentration profile.

Further, before thermally annealing to reduce the metallic element for promoting crystallization in the present invention, the thermal annealing can be performed at a lower temperature and in a shorter time by performing light annealing of the crystallized crystalline semiconductor film using laser light or strong light.

The metallic element is distributed within the semiconductor film in a molecular bonded state equivalent to $NiSi_x$. It is thought that the molecular bonds are cut by light annealing energy, and the metallic element for promoting crystallization is made into an atomic state, or the molecular bond energy is lowered, and therefore the metallic element remaining within the semiconductor film is in a state in which it easily moves within the crystalline semiconductor device film.

BRIEF DESCRIPTION OF THE DRAWINGS

In the accompanying drawings:

FIG. 11 is a cross sectional diagram of a liquid crystal panel of the present invention;

FIG. 14 is a diagram of the characteristics of a thresholdless antiferroelectric mixed liquid crystal;

DETAILED DESCRIPTION OF THE PREFERRED EMBODIMENTS

The embodiments of the present invention are explained using the figures.

Embodiment 1

Embodiment 1 is explained using FIGS. 3A to 4D. Embodiment 1 relates to a process of manufacturing an n-channel TFT, and n-type high concentration regions which become a source region and a drain region are used as gettering regions.

Figure 3A:
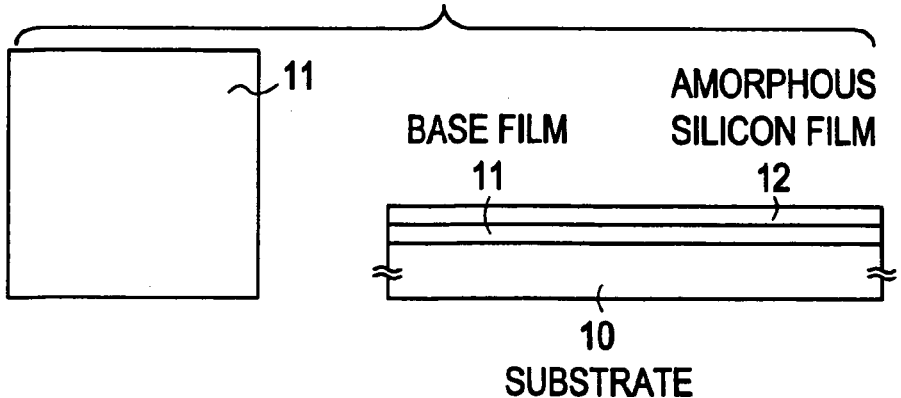
FIGS. 3A to 3D are cross sectional diagrams showing a manufacturing process of a TFT of the present invention.
Figure 3B:
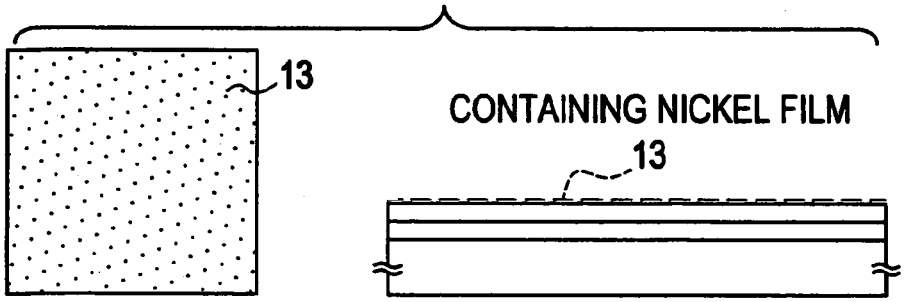
Figure 3C:
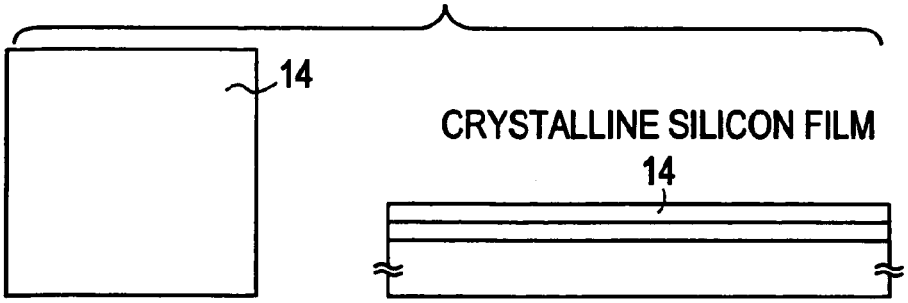

A substrate 10 is prepared as shown in FIG. 3A, and a base film 11 is formed on the surface of the substrate 10. Insulating substrates such as a glass substrate, a quartz substrate, and a ceramic substrate (also referred to as crystalline glass), can be used as the substrate 10. In addition, conducting substrates such as a single crystal silicon substrate, a copper substrate, substrates made from high melting point metallic elements such as Ta, W, Mo, Ti, and Cr, and alloys and compounds containing these metallic elements (for example, nitrogen alloys such as tantalum nitride, or silicide materials such as tungsten silicide) can be used as the substrate 10.

The base film 11 functions to prevent the diffusion of impurities from the substrate to a semiconductor device, to increase the adhesion of the semiconductor films and metallic films formed on the substrate 10, and to prevent peeling. A film such as a silicon oxide film, a silicon nitride film, or a silicon oxide nitride film, deposited by a method such as CVD, can be used as the base film 11. For example, when a single crystal silicon substrate is used, a base film can be formed when the surface is oxidized by thermal oxidation, forming a base film. Further, if a heat resistant substrate such as a quartz substrate or a single crystal silicon substrate is used, an amorphous silicon film may be formed, and the silicon film may be thermally oxidized.

In addition, a laminate film formed of a high melting point metallic film, such as tungsten, chromium, tantalum, or a film having high conductivity, such as aluminum nitrite, boron nitrate, DLC (diamond like carbon), or alumina as a lower layer, and the above inorganic film laminated as an upper layer may be used as the base film 11. In this case, since the heat generated by the semiconductor device is emitted from the base film 11, the operation of the semiconductor device becomes stable.

A semiconductor film having an amorphous portion is deposited contacting the surface of the base film 11. An amorphous silicon film 12 is deposited to a thickness of 55 nm by reduced pressure CVD here. (See FIG. 3A)

A metallic element for promoting crystallization is next introduced to the semiconductor film having an amorphous portion. Nickel is used as the metallic element here, and a film 13 containing nickel is formed on the surface of the amorphous silicon film 12 by an application method which uses a spinner.

A nickel acetate salt solution is applied to the surface of the amorphous silicon film 12 by a spinner, and is maintained in that state for several minutes. By drying with the spinner, a film containing the metallic element is formed as the film 13 containing nickel. Note that the film 13 containing nickel need not always be limited to a film state, and can be put to practical use even if not in a film state, provided that the nickel concentration of the nickel acetate salt solution is 1 ppm or greater, preferably 10 ppm or greater.

Before applying the nickel acetate salt solution here, an extremely thin silicon oxide film, about several nanometers, is formed here by irradiation of UV light in order to increase the wetability of the amorphous silicon film surface. It is possible for nickel from the film 13 containing nickel to pass through the silicon oxide film and react with the amorphous silicon because the silicon oxide film is thin. (See FIG. 3B.)

The amorphous silicon film 12 into which the nickel has been introduced is then thermally annealed in a furnace, forming a crystalline silicon film 14. Thermal annealing is performed here in a nitrogen environment at 550° C. for 8 hours. Nickel elements are in contact with the entire surface of the amorphous silicon film 12, so the nickel migration direction is from the surface of the amorphous silicon film 12 toward the base film 11. Crystallization advances in the silicon film 12 in accordance with the movement of the nickel, and the crystals grow in that direction. (See FIG. 3C.)

Figure 3D:
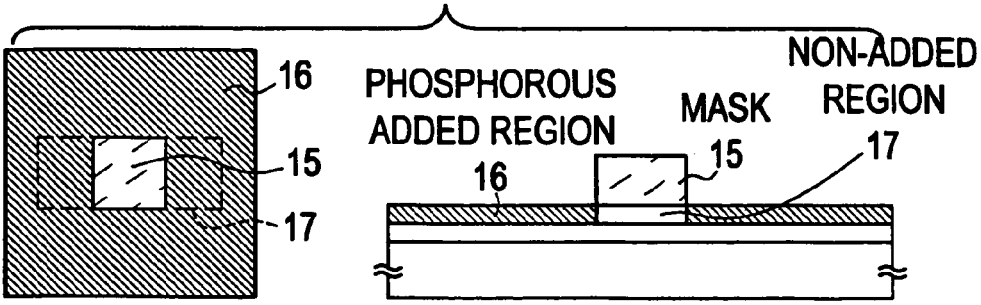
Figure 4A:
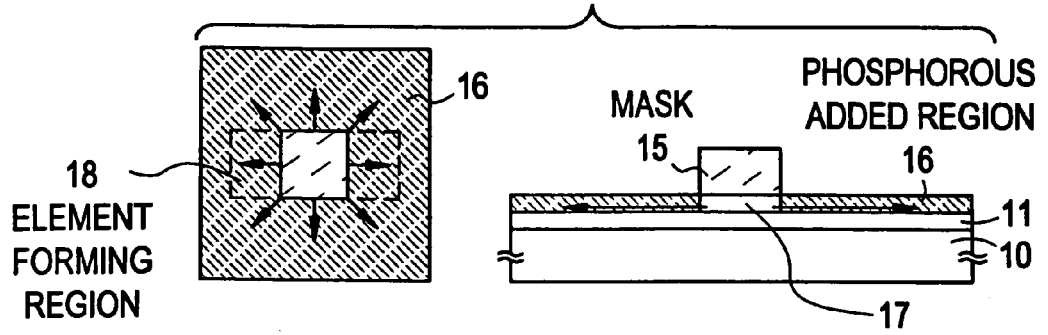
FIGS. 4A to 4D are cross sectional diagrams showing a manufacturing process of the TFT of the present invention.
Figure 4B:
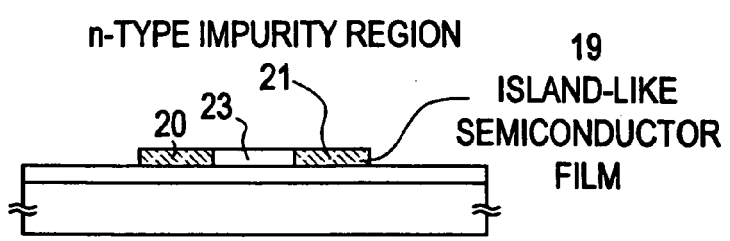
Figure 4C:
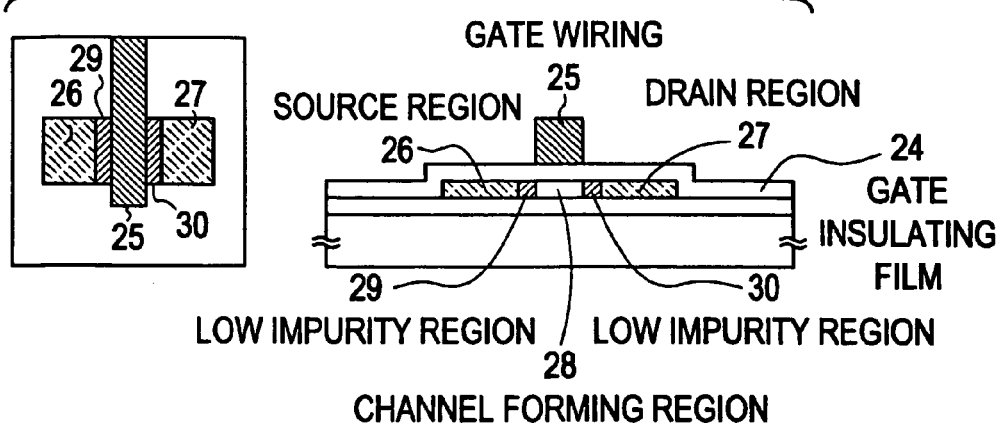
Figure 4D:
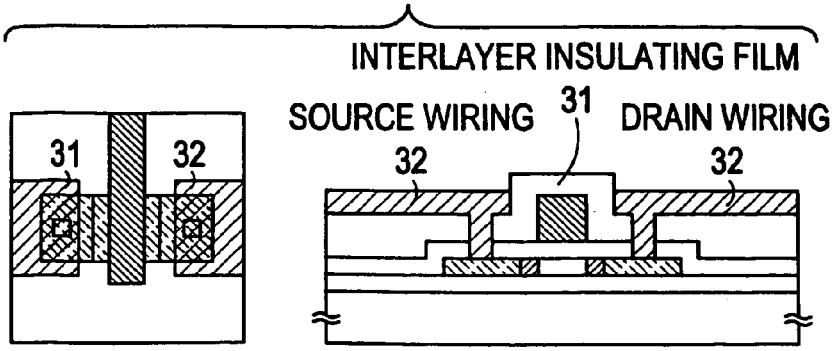
Figure 5A:
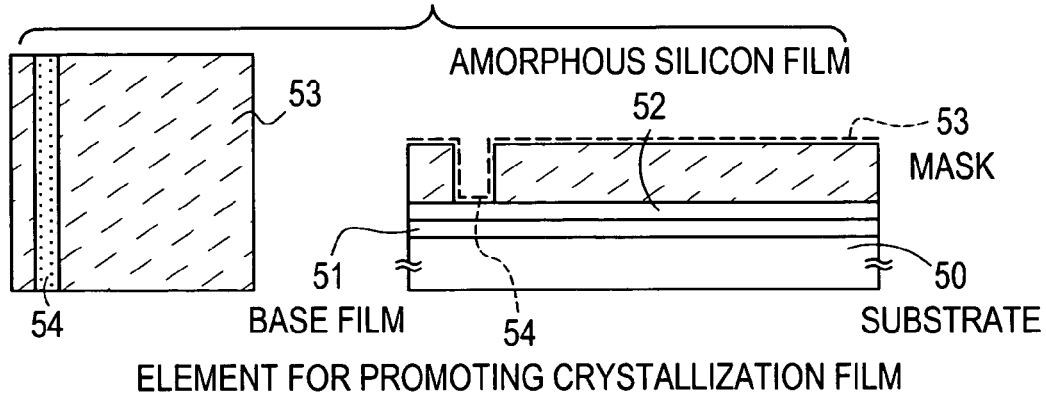
FIGS. 5A to 5D are cross sectional diagrams showing a manufacturing process of the TFT of the present invention.
Figure 5B:
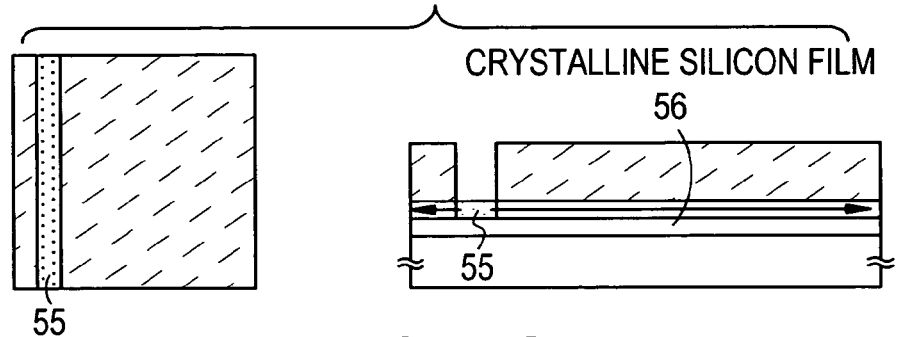
Figure 5C:
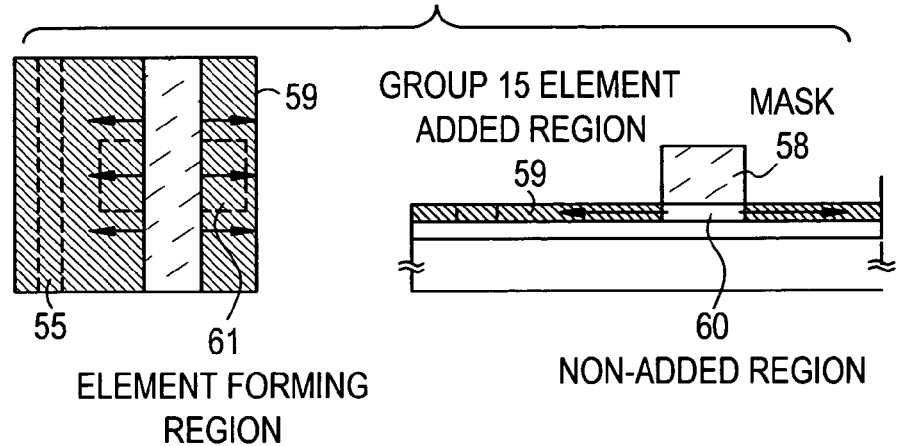
Figure 5D:
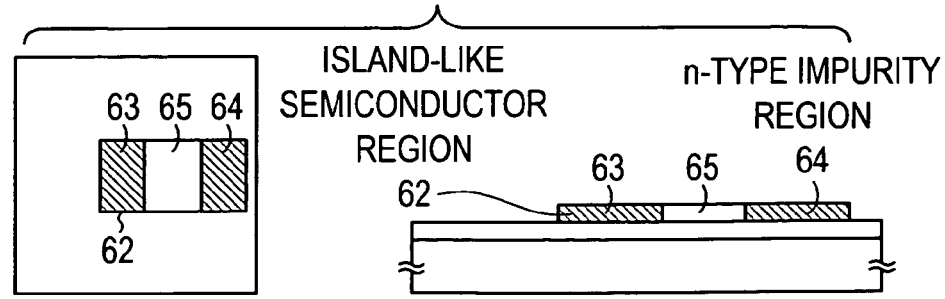
Figure 6A:
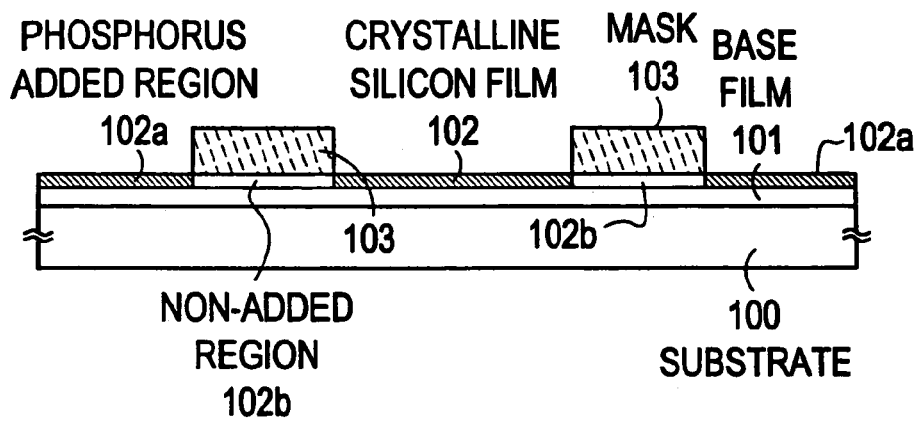
FIGS. 6A to 6D are cross sectional diagrams showing a manufacturing process of the TFT of the present invention.
Figure 6B:
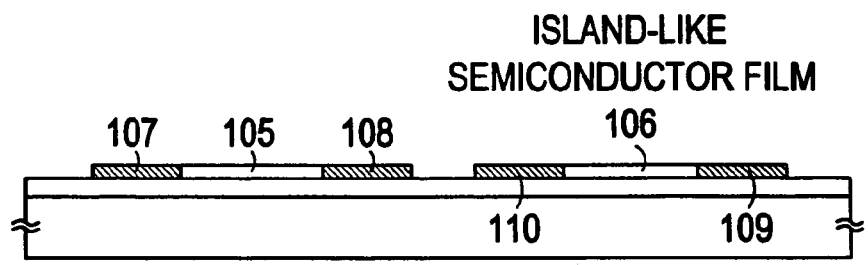
Figure 6C:
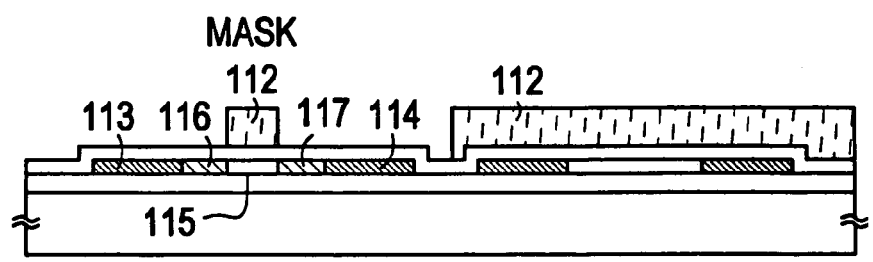
Figure 6D:
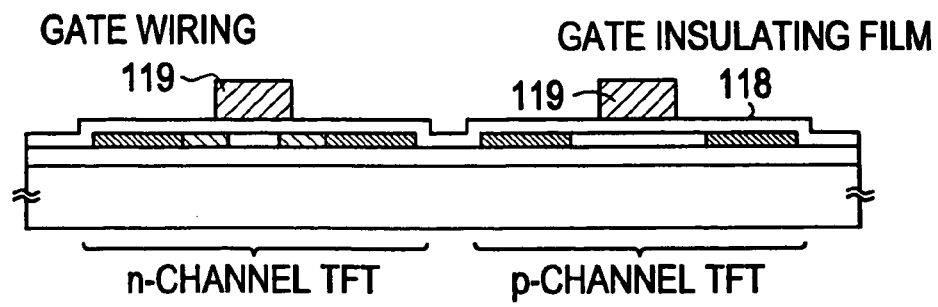
Figure 7A:
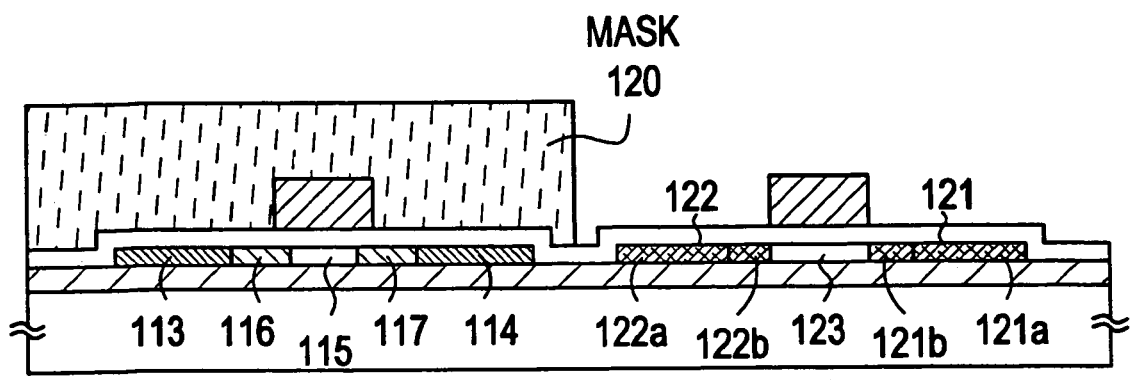
FIGS. 7A to 7C are cross sectional diagrams showing a manufacturing process of the TFT of the present invention.
Figure 7B:
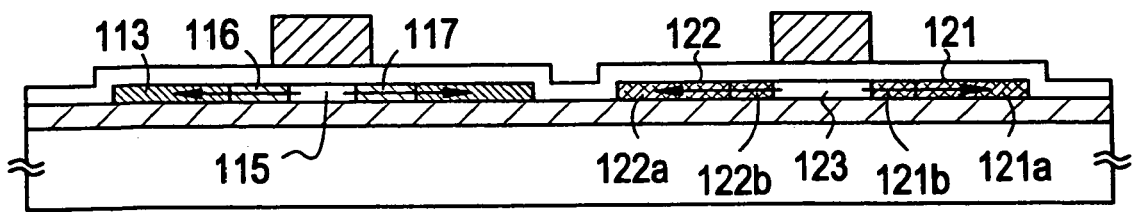
Figure 7C:
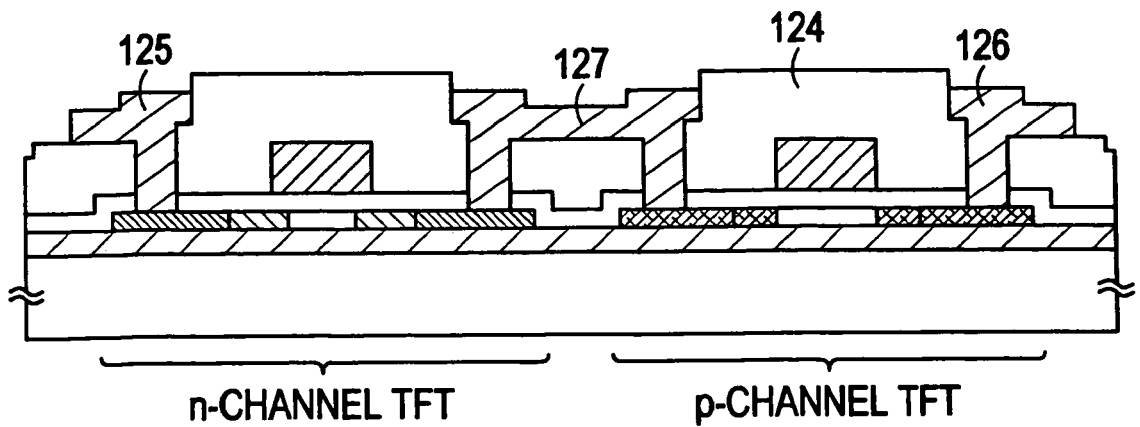
Figure 8A:
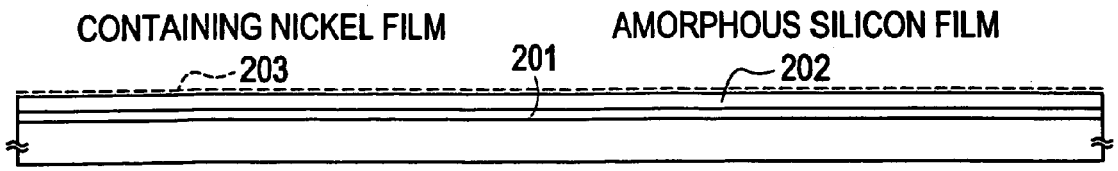
FIGS. 8A to 8F are cross sectional diagrams showing a manufacturing process of the TFT of the present invention.
Figure 8B:
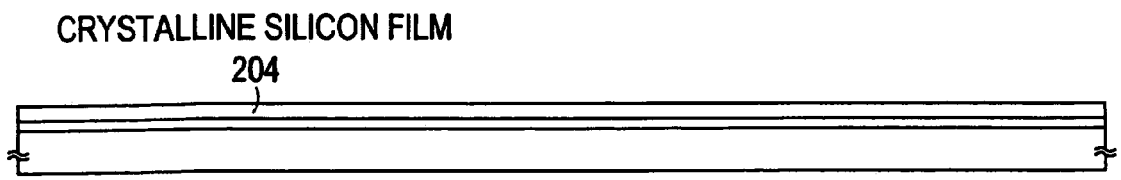
Figure 8C:
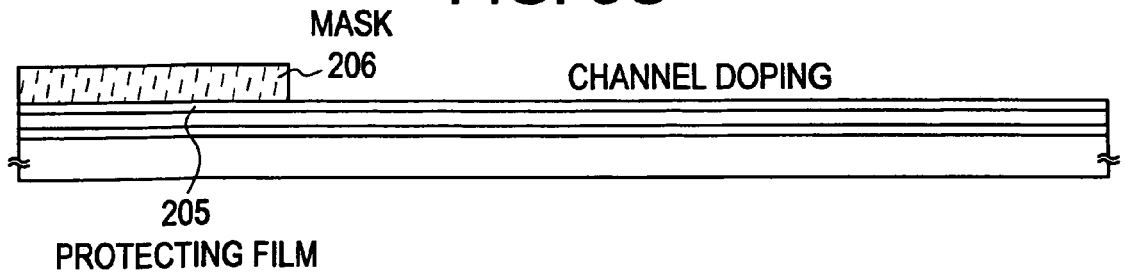
Figure 8D:
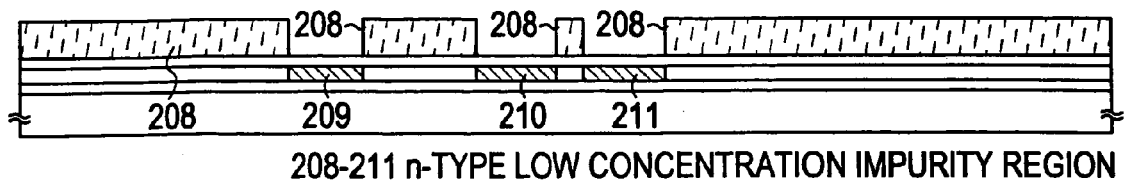
Figure 8E:
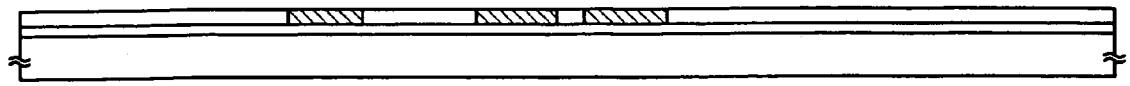
Figure 8F:
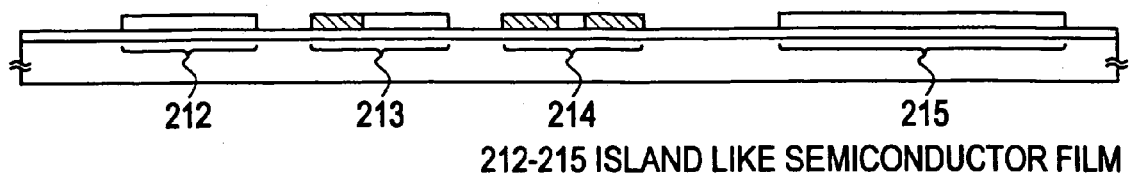
Figure 9A:
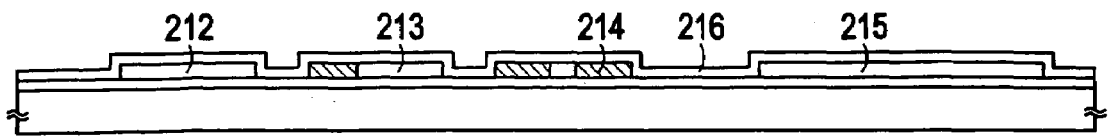
FIGS. 9A to 9F are cross sectional diagrams showing a manufacturing process of the TFT of the present invention.
Figure 9B:
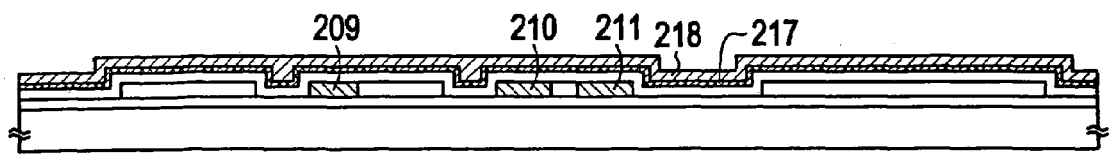
Figure 9C:
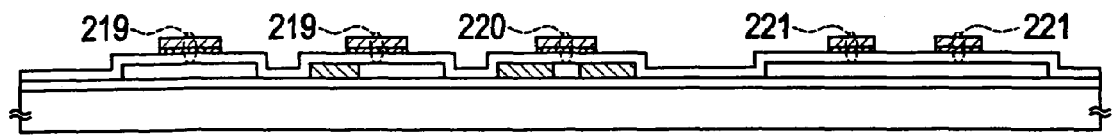
Figure 9D:
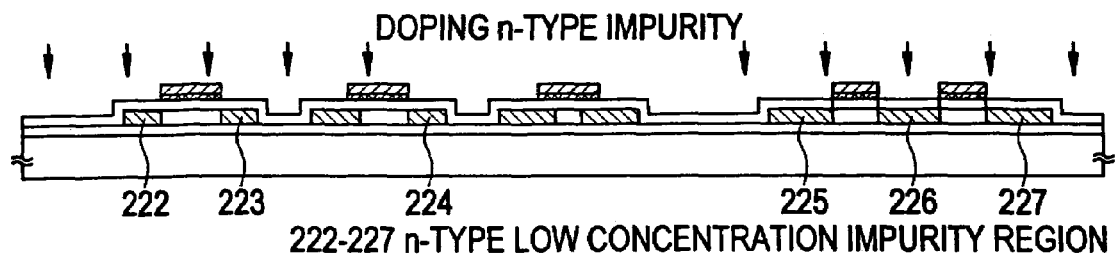
Figure 9E:
Figure 9F:
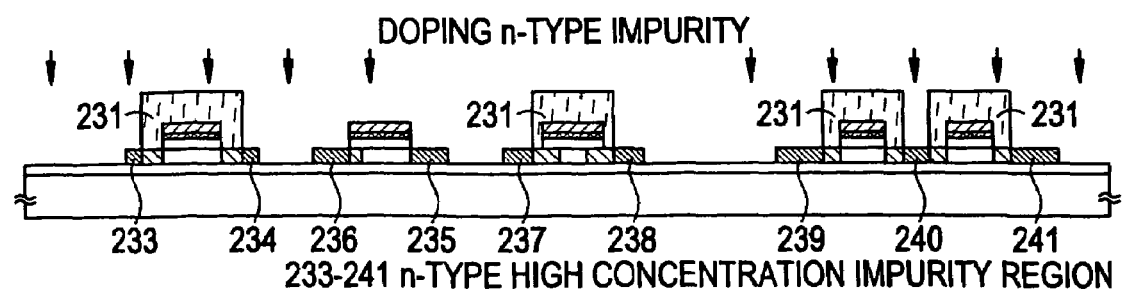

In the crystalline silicon film 14, a group 15 element, phosphorous here, is next added into the area which includes the regions that become the source region and the drain region of the TFT semiconductor film 15. In FIG. 3D, a rectangular region 18 enclosed by a dashed line is an element forming region which becomes a semiconductor layer of the TFT.

A mask 15 covers a region which becomes a channel forming region and a low concentration impurity region of the semiconductor layer in the element forming region 18. Resists and inorganic insulating films such as silicon oxide, silicon nitride, and silicon oxide nitride film can be used as the mask 15, and an inorganic insulating film is preferable because the mask contacts the channel forming region. A 100 nm thick silicon oxide film is deposited here, then patterned to form the mask 15. The crystalline silicon film 14 is light annealed by an excimer laser here, before forming the mask.

Figure 1:
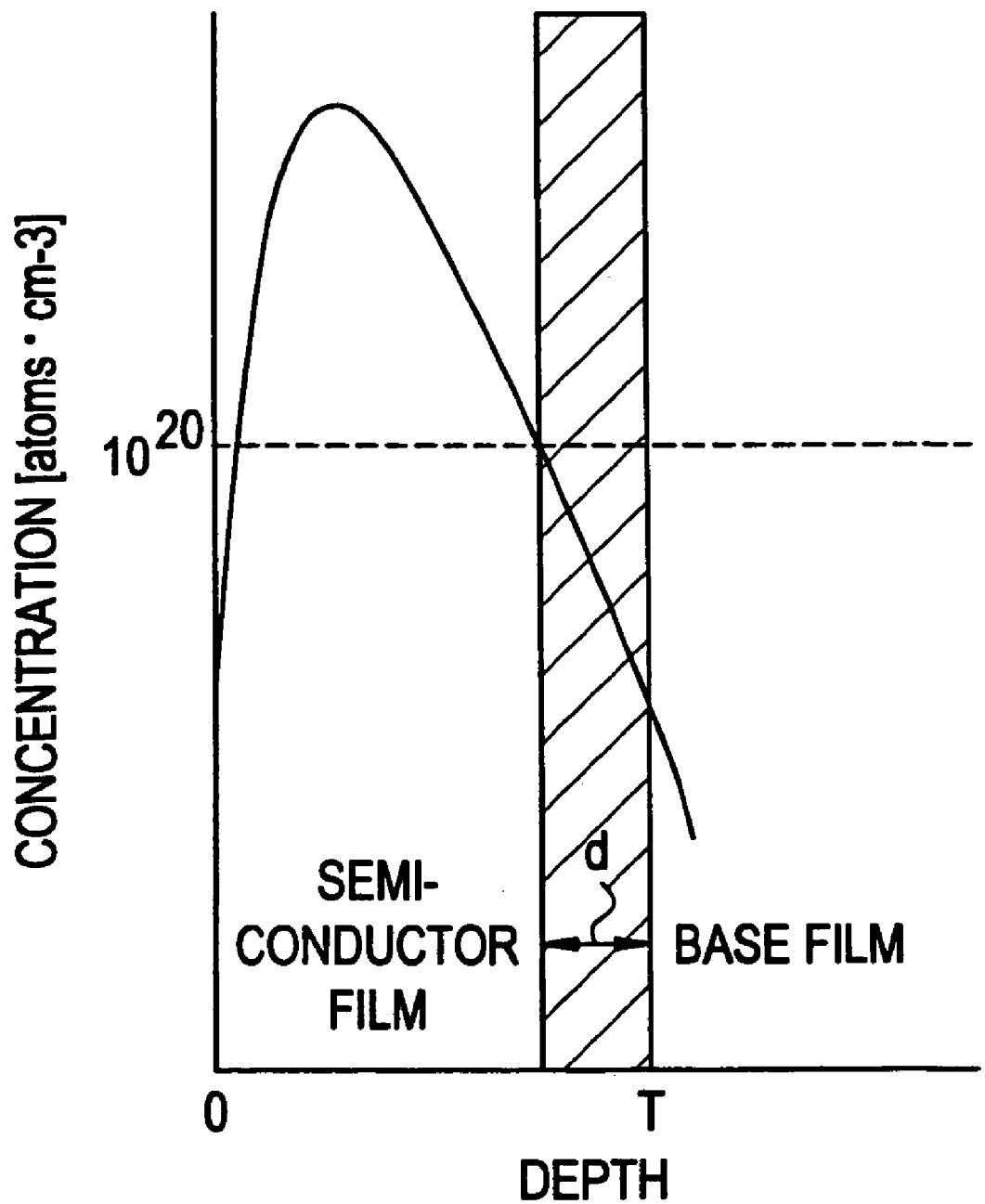
FIG. 1 is a concentration distribution diagram for the periodic table group 15 element of an n-type impurity region (gettering region) of the present invention.
Figure 2:
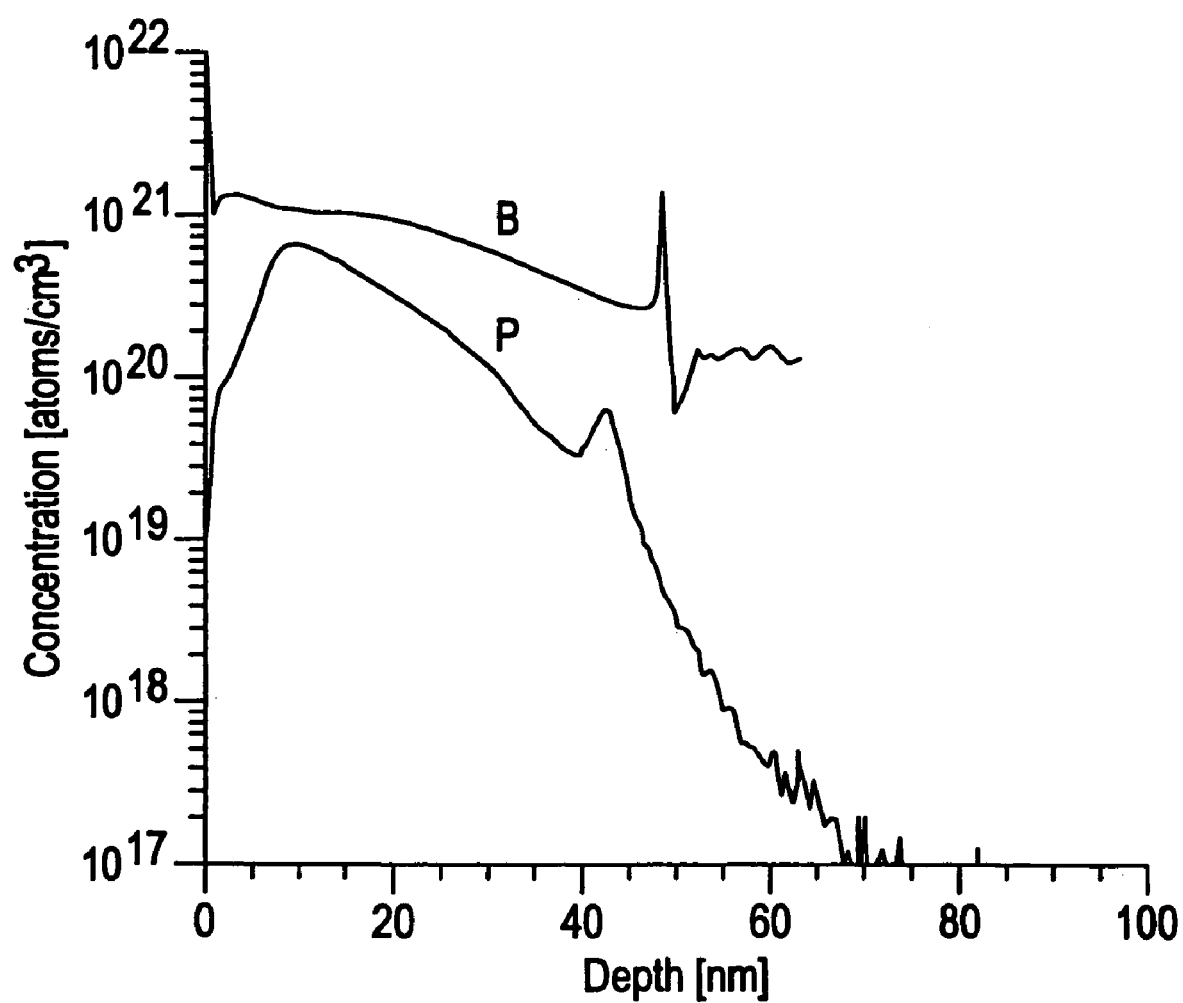
FIG. 2 is a phosphorous and boron concentration distribution diagram for a gettering region of the present invention.

Phosphorous is then selectively added by an ion doping device, forming a phosphorous added region 16 in the crystalline silicon film 14. The phosphorous concentration profile is made to contain the profile as explained previously using FIG. 1, and therefore the doping conditions are: an acceleration voltage of 10 kV, and a set dosage of $1.5 \times 10^{14}$ ions/cm² using phosphine diluted to 5% by hydrogen as the doping gas. For convenience, the region not added with phosphorous is referred to as a non-added region 17 here. (See FIG. 3D.)

The crystalline silicon film 14 is thermally annealed next, and the nickel in the non-added region 17 is gettered into the phosphorous added region 16. The annealing temperature is set to 600° C. here, and the annealing time is 8 hours. The nickel within the non-added region 17 moves toward the phosphorous added region, as shown by the arrows, by the thermal doping, and combines with the phosphorous of the phosphorous added region 16. The nickel concentration in the non-added region 17 becomes $2 \times 10^{17}$ atoms/cm³ or less. In addition, the crystallinity of the phosphorous added region 16 which has been damaged during doping is restored by the thermal annealing, and the added phosphorous is activated. (See FIG. 4A.)

After removing the mask 15, the crystalline silicon film 14 is patterned, forming an island-like semiconductor film. Note that the mask may be removed before the thermal annealing for gettering. The phosphorous added region 16 is patterned so as to become n-type impurity regions 20 and 21 of the TFT, and the non-added region 17 becomes a region 23 in which a channel forming region and a low concentration impurity region are to be formed. (See FIG. 4B.)

An island-like semiconductor film 19 is covered next by forming a gate insulating film 24, a gate wiring 25 on the gate insulating film 24 is used as a mask, and phosphorous is added into the island-like semiconductor film 19, forming low concentration impurity regions. Phosphine diluted to 5% by hydrogen is used as the doping gas. An ion doping device is used, and the acceleration voltage is set to 90 kV, with the set dosage at $3\times10^{13}$ ions/cm$^2$.

As a result of doping, a source region 26, a drain region 27, a channel forming region 28, and low impurity regions 29- and 30 are formed in a self-aligning manner. Phosphorous is added to a concentration on the order of $10^{16}$ to $10^{19}$ atoms/cm$^3$ here in the low concentration impurity regions 29 and 30 by this doping process. Therefore, the phosphorous concentration profile of the source region 26 and the drain region 27 does not change much from that of the n-type impurity regions 20 and 21, and concentration profile conditions with which it is possible to recrystallize are maintained.

After doping, an excimer laser is irradiated, activating the phosphorous added into the source region 26, the drain region 27, and the low concentration impurity regions 29 and 30. An interlayer insulating film 31 is then formed, and contact holes are formed in the interlayer insulating film 31 to reach the source region 26 and the drain region 27. A source wiring 32 and a drain wiring 33 are then formed. (See FIG. 4D.)

Embodiment 2

Embodiment 2 is explained using FIGS. 5A to 5D. In embodiment 2, the nickel introduction method is changed from that of embodiment 1, and the rest is similar to that of embodiment 1.

A base film 51 is formed on the surface of a substrate 50. An amorphous silicon film is formed by reduced pressure thermal CVD as a semiconductor film containing amorphous portions. The film thickness of the amorphous silicon film is set to 55 nm.

A 120 nm thick silicon oxide film is deposited on the amorphous silicon film 52, and an open section is formed, and this is taken as a mask 53. The open section of the mask prescribes a region added with nickel. A resist or a silicon oxide film can be used as the mask 53.

A solution of a nickel acetate salt containing 10 ppm by weight nickel dissolved in ethanol is then applied by spin coating and dried, forming a film 54 containing nickel. (See FIG. 5A.)

Thermal annealing is performed next in a nitrogen environment at 570° C. for 8 hours, crystallizing the amorphous silicon film 52 and forming a crystalline silicon film 56. A nickel and silicon reaction begins in a region 55 exposed by the open section in the amorphous silicon film 52. With this region 55 as a starting point, nickel diffuses within the silicon film 52 as shown schematically by the arrows due to the thermal annealing, and the silicon film is crystallized. The heat treatment process is performed at 570° C. for 8 hours here, forming a crystalline semiconductor film 56 containing nickel. (See FIG. 5B.)

The silicon crystallization thus proceeds preferentially from the nickel silicide reacted in the region 55, and crystal growth is nearly parallel to the surface of the substrate 50. Therefore, along with the growth of large crystal grains, the crystal growth directions line up, and overall crystallinity is superior.

Observation by TEM (transmission electron microscopy) shows that the grains in the crystalline silicon film 56 have a rod-shape or flattened rod shape, and that the grain orientations are almost in alignment. Nearly all of the crystals have a {110} orientation, with the <100> and <111> axes identical between each crystal, and the <110> axis varying by approximately 2°. Thus the bonding between atoms in the grain boundaries is smooth, and there are only few un-bonded sites, because the crystal axis orientation is in alignment.

In conventional polycrystalline silicon, many atoms exist which cannot bond in the grain boundaries because the crystal axis directions are irregular for each grain. The crystal structures of the crystalline silicon film of the present invention and a conventional polycrystalline silicon film differ completely at this point. The bonding between most of the atoms in the crystal boundaries is uninterrupted, and two crystal grains join together with extremely good matching, so the crystalline silicon film is a structure in which the crystal lattice is connected with continuity, and in which it is extremely difficult to make a trap state, which is caused by defects.

After removing the mask 53, a mask 58 is formed in order to selectively dope phosphorous. In embodiment 2, the mask 58 is formed in a belt shape wider than an element forming region 61. The mask 58, of course, covers section which become a channel forming region and a low concentration impurity region. Further, nickel remains at a high concentration in the region 55 because nickel is first added there, and therefore it is preferable that this region is not contained in the element forming region 61.

Phosphorous is added by an ion doping device, selectively forming a phosphorous added region. The doping conditions are set at an acceleration voltage of 10 kV and a set dosage of $1.5\times10^{13}$ ions/cm$^2$ using phosphine diluted to 5% by hydrogen as the doping gas. For convenience, the region not added with phosphorous is referred to as a non-added region 60. (See FIG. 5C.)

After forming a phosphorous added region 59, thermal annealing is then performed for 12 hours at 600° C., and the nickel contained in the non-added region 60 is gettered into the phosphorous added region 59. (See FIG. 5C.)

After thermally annealing for gettering, the silicon film is patterned into an island-like, forming an island-like semiconductor film 61. The island-like semiconductor film 61 is made up of the phosphorous added region which becomes n-type impurity regions 63 and 64 containing a high concentration of nickel, and a region 65 from the non-added region 60 which contains a low concentration of nickel. A channel forming region and a low concentration impurity region of the TFT are formed in the region 65. (See FIG. 5D.)

Embodiment 3

Embodiment 3 is explained using FIGS. 6A to 7C. Embodiment 3 is related to a process of manufacturing a CMOS circuit by forming an n-channel TFT and a p-channel TFT on the same substrate, and shows an example of using a region for gettering a metallic element in a source region and a drain region of each TFT.

A 300 nm thick silicon oxide film 101 is formed on a substrate 100 as the base film, and a crystalline silicon film 102 is formed in accordance with the method of embodiment 1 or embodiment 2. A mask 103 is formed from a silicon oxide film with a thickness of 120 nm in order to selectively dope phosphorous. Phosphorous is then added into the crystalline silicon film by using an ion doping device, forming a phosphorous added region 102a. A region 102b not added with phosphorous is referred to as the non-added region 102b. The non-added region 102b contains a region which becomes a channel forming region of the TFT, and in the case of the n-channel TFT, also contains a region which becomes a low concentration impurity region.

The phosphorous doping conditions are set at an acceleration voltage of 10 kV and a set dosage of $1.5 \times 10^{13}$ ions/cm$^2$ using phosphine diluted to 5% by hydrogen as the doping gas.

The crystalline silicon film 102 is patterned into an island-like, forming island-like semiconductor films 105 and 106. The island-like semiconductor films 105 and 106 are made up of n-type impurity regions 107 to 110 from the phosphorous added region 102a containing a high concentration of nickel, and regions 105 and 106 from the non-added impurity region 102b in which the nickel concentration has been reduced. The channel forming region and the low concentration impurity region of the n-channel TFT are formed in the region 105 which has a lowered nickel concentration. A channel forming region of the p-channel TFT, and a p-type high concentration impurity region which becomes a source region and a drain region are formed in the region 106. (See FIG. 6B.)

A gate insulating film 111 is formed from a silicon oxide nitride film by plasma CVD using SiH$_4$ and N$_2$O as raw material gasses. A mask 112 is formed from resist in order to form a low concentration impurity region in the island-like semiconductor film 105. In order to form the low concentration impurity region, phosphine diluted to 5% by hydrogen is used as a doping gas, and the acceleration voltage is set to 90 kV with a set dosage of $5.4 \times 10^{11}$ ions/cm$^2$. A source region 113, a drain region 114, a channel forming region 115, and low concentration impurity regions 116 and 117 are formed in a self-aligning manner in the island-like semiconductor film 105. (See FIG. 6C.)

After removing the mask 112, a laminate film of a tantalum nitride film and a tantalum film is formed on the gate insulating film 111 by sputtering and then patterned, forming a gate wiring 119. The gate wiring 119 is common between the n-channel TFT and the p-channel TFT, and is formed so as to overlap a portion of the low concentration impurity regions 116 and 117 of the n-channel TFT. Further, light annealing of the island-like semiconductor films 105 and 106 is performed by an excimer laser before forming the gate wiring 119. (See FIG. 6D.)

A mask 120 is formed from resist in order to dope boron into the island-like semiconductor film 106. Diborane diluted to 5% by hydrogen is used as the doping gas. The acceleration voltage is set to 10 kV, and the set dosage is $8.4 \times 10^{14}$ ions/cm$^2$.

P-type high concentration impurity regions 121 and 122, and a channel forming region 123 are formed in a self-aligning manner. The region 121 becomes a source region, and the region 122 becomes a drain region. Both phosphorous and boron are added into regions 121a and 122a, which function as gettering regions. Only boron is added into regions 121b and 122b. (See FIG. 7A.)

The mask 120 is removed, and thermal annealing is performed for 8 hours at 600° C. The nickel in the channel forming region 115 and in the low concentration impurity regions 116 and 117 diffuses as shown by the arrows into the source region 113 and the drain region 114 by thermal annealing, where it is gettered. Further, the nickel in the channel forming region 123 diffuses into the source region 121 and the drain region 122, and is gettered in regions 121a and 122b. (See FIG. 7B.)

An interlayer insulating film 124 is formed from a silicon oxide film. After forming contact holes in the interlayer insulating film 124, a laminate film made from titanium/aluminum/titanium is formed as an electrode material and patterned, forming wirings 125 to 127. The n-channel TFT and the p-channel TFT are connected by the wiring 127, forming a CMOS circuit. (See FIG. 7C.)

Embodiment 4

Embodiment 4 relates to an active matrix type liquid crystal display device, and FIGS. 8A to 10C are used to explain a method of manufacturing an active matrix substrate on which a pixel section and driver circuits, in order to drive the pixel section TFTs, are formed on the same substrate. Note that in order to simplify the explanation of the driver circuits, a method of manufacturing a CMOS circuit, a basic circuit for circuits such as a shift register circuit and a buffer circuit, and of manufacturing an n-channel TFT for forming a sampling circuit, are explained.

A laminate base film 201 of a 50 nm thick silicon oxide nitride film and a 150 nm thick silicon oxide film is formed on the surface of a glass substrate 200. An amorphous silicon film 202 with a thickness of 50 nm is formed on the base film 201 by plasma CVD. After oxidizing the surface of the amorphous silicon film 202 by UV light, a nickel acetate solution is applied by a spinner and dried, forming a nickel containing film 203. (See FIG. 8A.)

Thermal annealing is performed at 600° C. for 8 hours, crystallizing the amorphous silicon film 202 and forming a crystalline silicon film 204. The nickel in the film 203 reacts with the silicon of the amorphous silicon film 202 by thermal annealing, forming a nickel silicide, while the nickel diffuses toward the base film 201, promoting crystallization.

A protecting film 205 is formed on the crystalline silicon film 204. The protecting film 205 is formed of a silicon oxide nitride film or a silicon oxide film with a thickness from 100 to 200 nm (preferably between 130 and 170 nm). The protecting film 205 has a significance for preventing the crystalline silicon film 204 from being directly exposed to the plasma during doping, and for making fine concentration control possible.

A mask 206 is formed from resist on the protecting film 205. Boron is then selectively added through the protecting film 205. Diborane (B$_2$H$_6$) is plasma excited without mass separation by an ion doping device, and boron is added. Boron is added to a concentration of $1 \times 10^{15}$ to $1 \times 10^{18}$ atoms/cm$^3$ (typically between $5 \times 10^{16}$ and $5 \times 10^{17}$ atoms/cm$^3$). (See FIG. 8C.) This process is a process of doping an impurity which imparts p-type conductivity into a region which becomes a channel forming region in a semiconductor in order to control the threshold voltage of the n-channel TFT, and is a process called channel doping. (See FIG. 8C.)

The mask 206 is removed, and a new mask 208 is formed from resist. Phosphorous is then added, forming n-type low concentration impurity regions 209 to 211. The low concentration impurity regions 209 to 211 become LDD regions of the n-channel TFTs of the CMOS circuit sand the sampling circuit. Phosphine diluted to 5% is plasma excited in an ion doping device, and is added. The doping conditions may be set so that the concentration of phosphorous in the low concentration impurity regions 209 to 211 is from $2 \times 10^{16}$ to $5 \times 10^{19}$ atoms/cm$^3$ (typically between $5 \times 10^{17}$ and $5 \times 10^{18}$ atoms/cm$^3$). (See FIG. 8D.)

The mask 207 and the protecting film 205 are removed, and light annealing is performed by laser light. Pulse emission type excimer laser light is formed into a linear shape and irradiated. The laser annealing conditions are: KrF gas is used as the excitation gas, the process temperature is room temperature, the pulse emission frequency is set to 30 Hz, and the laser energy density is set from 100 to 300 mJ/cm$^2$ (typically between 150 and 250 mJ/cm$^2$). (See FIG. 8E.)

Along with the activation of added phosphorous and boron, light annealing is performed in order to recrystallize the semiconductor film which has become amorphous during doping, and in order to make the nickel remaining in the crystalline silicon film 204 easy to diffuse.

The crystalline silicon film 204 is patterned into island-likes next, forming island-like semiconductor films 212 to 215. The semiconductor films 212 and 213 structure the CMOS circuit, the semiconductor film 214 structures the n-channel TFT of the sampling circuit, and the semiconductor film 215 structures the n-channel TFT of the pixel section. (See FIG. 8F.)

A gate insulating film 216 is formed next, covering the semiconductor films 212 to 215. A silicon oxide nitride film with a thickness of 115 nm is deposited as the gate insulating film 216 by plasma CVD using N$_2$O and SiH$_4$ as raw ingredient gasses. (See FIG. 9A.)

A laminate of a 50 nm thick tungsten nitride (WN) film 217 and a 350 nm thick tungsten film 218 is deposited on the gate insulating film 216 by sputtering. Note that, although not shown in the figures, it is effective to form a silicon film of 2 to 20 nm in thickness under the tungsten nitride film 217. The adhesion of the tungsten nitride film is improved by the silicon film, and oxidation can be prevented.

The tungsten nitride film 217 and the tungsten film 218 are etched together, forming gate wirings 219 to 221 with a thickness of 400 nm. The gate wiring 219 formed in the CMOS circuit is formed so as to partially overlap the n-type low concentration impurity region 209 of the semiconductor film 213, and the gate wiring 220 of the TFT of the sampling circuit is formed so as to partially overlap the n-type low concentration impurity regions 210 and 211. (See FIG. 9C.)

Phosphorous is added with the gate wirings 219 and 220 as masks, forming n-type low concentration impurity regions 222 to 227 in a self-aligning manner. The phosphorous concentration in the low concentration impurity regions 222 to 227 is between one-tenth and one-half (typically between one-quarter and one-third) that of the n-type low concentration impurity regions 209 and 210. However, the concentration is between 5 and 10 times higher than the boron concentration added by the above channel doping process. This is because boron is already added into the regions 224 to 227 beforehand, and therefore to impart n-type conductivity. Specifically, the concentration is set from $1\times10^{16}$ to $5\times10^{18}$ atoms/cm$^3$, typically between $3\times10^{17}$ and $3\times10^{18}$ atoms/cm$^3$. Excluding the areas covered by the gate wirings, phosphorous is added into the island-like semiconductor film by this doping process to a concentration of $1\times10^{16}$ to $5\times10^{18}$ atoms/cm$^3$. (See FIG. 9D.)

The gate insulating film 216 is etched in a self-aligning manner using the gate wirings 219 to 221 as masks. A dry etching method is used for the etching, and CHF$_3$ gas is used as the etching gas. However, it is not necessary to limit the etching gas to CHF$_3$. Gate insulating films 228 to 230 are thus formed under the gate wirings. (See FIG. 9E.)

By thus exposing the active layers in this way, the acceleration voltage can be lowered during the next impurity element doping process. Further, the necessary dosage is made smaller, and the throughput is increased. Impurity regions may be formed by through doping, leaving the gate insulating film as is without etching.

A resist mask 231 is formed next, and phosphorous is added, forming source/drain regions of the n-channel TFT. N-type high concentration impurity regions 233 to 241 are formed by ion doping using phosphine diluted by hydrogen. The doping conditions are an acceleration voltage of 10 kV and a set dosage of $1.5\times10^{13}$ ions/cm$^2$.

The n-type high concentration impurity regions manufactured by this phosphorous doping process function as gettering regions in order to getter the nickel contained in the channel forming region and the low concentration impurity regions of the TFT. (See FIG. 9F.)

The mask 231 is removed next, and a new mask 242 is formed. Plasma excitation of diborane diluted by hydrogen is performed by an ion doping device, and boron is added into the semiconductor film. P-type high concentration impurity regions 243 and 244 are formed in the semiconductor film 212. The boron doping conditions are an acceleration voltage of 10 kV and a set dosage of $7.8\times10^{14}$ ions/cm$^2$. (See FIG. 10A.)

After removing the mask 242, a 200 nm thick silicon oxide nitride film (in which the nitrogen concentration is between 25 and 50 atomic %) is deposited by plasma CVD with SiH$_4$, N$_2$O, and NH$_3$ as raw material gasses, forming a first interlayer insulating film 245. Thermal annealing is then performed in a nitrogen environment at 600° C. for 6 hours. Along with the activation of the phosphorous and boron added into the semiconductor films of each TFT, the nickel remaining in each TFT channel forming region and low concentration impurity regions diffuses into p-type impurity regions 243a and 244a which contain high concentrations of phosphorous and boron, and into the n-type impurity regions 236 to 241, which contain a high concentration of phosphorous, as shown by the arrows, where it is captured. In addition, along with activation of the phosphorous and boron added into the semiconductor film, the crystallinity damaged by doping is restored and recrystallized by the thermal annealing process. (See FIG. 10B.)

In addition, heat treatment is performed for 1 to 12 hours at 300 to 450° C. in an environment containing from 3 to 100% of hydrogen, performing hydrogenation of the island-like semiconductor films. This process is one of terminating dangling bonds in the semiconductor layers by hydrogen which is thermally excited. Plasma hydrogenation (using hydrogen excited by a plasma) may also be performed as another means of hydrogenation.

After completing thermal annealing for activation and for gettering, an 800 nm thick silicon oxide film is deposited on the first interlayer insulating film 245 by plasma CVD, which is taken as a second interlayer insulting film 246. Thus a 1 µm thick interlayer insulating film, a laminate film of the first interlayer insulating film (silicon oxide nitride film) 245 and the second interlayer insulating film (silicon oxide film) 246, is formed.

Contact holes are then formed in the interlayer insulating films 245 and 246 to reach the source region or the drain region of each TFT, and source wirings 248 to 251, and drain wirings 252 to 255 are formed. Note that, although not shown in the figures, the drain wirings 252 and 253 are connected as the same wiring in order to form the CMOS circuit. The wirings are formed by a 3 layer film made up of a 100 nm Ti film, a 300 nm aluminum film containing Ti, and a 150 nm Ti film formed in succession by sputtering.

A silicon nitride film, a silicon oxide film, or a silicon oxide nitride film is formed as a passivation film 256 at a thickness of between 50 and 500 nm (typically from 200 to 300 nm). A third interlayer insulating film 257 is then formed from an organic resin with a thickness of approximately 1 μm. Materials such as polyimide, acrylic, polyamide, polyimide amide, and BCB (benzocyclobutane) can be used as the organic resin. The following can be given as advantages of using an organic resin film: a simple deposition method; the parasitic capacity can be reduced because the specific dielectric constant is low; and superior levelness. Note that materials other than those stated above such as organic resin films, or organic SiO compound materials can also be used. A thermal polymerization type polyimide is used here, and it is formed by firing at 300° C. after application to the substrate.

A 125 nm thick aluminum film containing 1 wt % titanium is deposited on the third interlayer insulating film 257 in the pixel section, and then patterned, forming a shielding film 258. Note that the term shielding film is used throughout this specification with the meaning of shielding from light and electromagnetic waves.

It is possible to form other connection wirings by the aluminum film containing titanium, and not only the shielding film. For example, a connecting wiring can be formed for connection between circuits within a control circuit. However, in that case it is necessary to form contact holes ahead of time in the third interlayer insulating film, before depositing the material which forms the shielding film and the connection wirings.

Next, an aluminum oxide 259 is formed with a thickness of 20 to 100 nm (preferably between 30 and 50 nm) on the surface of the shielding film 258 by anodic oxidation or plasma oxidation (anodic oxidation is used in embodiment 4). First, an ethylene glycol tartaric acid solution with a sufficiently small alkaline ion concentration is prepared. This is a solution in which a 15% aqueous solution of ammonium tartaric acid and ethylene glycol are mixed at a ratio of 2:8, and aqueous ammonia is added so that the pH is regulated to be 7±0.5. A platinum electrode is then formed in the solution as a cathode, the substrate on which the shielding film 258 has been formed is immersed in the solution, and a constant direct current (from several mA to several tens of mA) is applied with the shielding film 258 as an anode, forming the aluminum oxide 259 on the surface of the shielding film 258 with a thickness of approximately 50 nm. The film thickness of the shielding film 258 becomes 90 nm due to anodic oxidation.

Contact holes to reach the drain wiring 255 are then formed in the third interlayer insulating film 257 and the passivation film 256, and a pixel electrode 260 is formed. Note that pixel electrodes 261 and 262 are each pixel electrodes of different, neighboring pixels. A transparent conducting film may be used for the pixel electrodes 260 to 262 for the case of a transmitting type liquid crystal display device, and a metallic film may be used for the case of a reflecting type liquid crystal display device. A transmitting type liquid crystal display device is used here, and therefore a 110 nm thick indium tin oxide (ITO) film is formed by sputtering.

Further, the pixel electrode 260 and the shielding film 258 overlap through the alumina 259 at this time, forming a storage capacitor 263. Note that it is preferable to set the shielding film 258 to a floating state (an electrically isolated state) or to a fixed electric potential, preferably a common electric potential (the intermediate electric potential of an image signal to be inputted to the source wiring).

The active matrix substrate, having the driver circuit and the pixel circuit on the same substrate, is thus completed. Note that in FIG. 10C, a p-channel TFT 301, and n-channel TFTs 302 and 303 are formed in the driver circuit, and a pixel TFT 304 formed from an n-channel TFT is formed in the pixel section.

A channel forming region 311, and a source region 312 and a drain region 313 from a p-type high concentration impurity region, are formed in the island-like semiconductor film of the p-channel TFT 301 of the driver circuit. The source region 312 and the drain region 313 include regions containing phosphorous and boron which become gettering regions, and gettered nickel exists in these regions at a concentration of $5 \times 10^{18}$ atoms/cm$^3$ or greater (typically between $1 \times 10^{19}$ and $5 \times 10^{20}$ atoms/cm$^3$).

A channel forming region 314, a source region 315, and a drain region 316, are formed in the island-like semiconductor film of the n-channel TFT 302 of the driver circuit, and a region 317 which overlaps the gate wiring through the gate insulating film is formed in the drain region side of the channel forming region 314. (A region such as the region 317 is referred to as an Lov region. Note that "ov" is attached to mean overlap.)

Further, a channel forming region 318, a source region 319, and a drain region 320 are formed in the island-like semiconductor film of the n-channel TFT 303, and n-type low concentration impurity regions 321 and 322 are formed in both sides of the channel forming region. Regions 321 and 322 include regions ($L_{ov}$ regions) which overlap the gate wiring through a gate insulating film and regions which do not overlap the gate wiring. (Regions which do not overlap the gate wiring are called $L_{off}$ regions throughout this specification. Note that "off" is attached to mean offset.)

Furthermore, channel forming regions 323 and 324, n-type high concentration impurity regions 325 to 327, and n-type low concentration impurity regions (Loff regions) 328 to 331, which are regions that do not overlap the gate wiring, are formed in the island-like semiconductor film of the TFT 304 of the pixel section.

The structure of the TFTs formed in each circuit is optimized in embodiment 4 corresponding to the required circuit specifications in the pixel circuit and the control circuit, and the operation performance and the reliability of the semiconductor device can be improved. Specifically, by differing the placement of the n-type low concentration impurity regions in the n-channel TFTs in accordance with the circuit specifications, and by proper use of an $L_{ov}$ region or an $L_{off}$ region, it is possible to fabricate a TFT structure which places importance on high speed operation or hot carrier prevention, and a TFT structure which places importance on a low off current operation, on the same substrate.

For example, in the case of an active matrix type liquid crystal display device, the structure of the n-channel type TFT 302 is suitable for control circuits which place importance on high speed operation such as a shift register circuit, a frequency divider circuit, a signal partitioning circuit, a level shifter circuit, and a buffer circuit. In other words, by placing the $L_{ov}$ region only on one side of the channel forming region (the drain side), this becomes a structure in which resistive components are reduced as much as possible and which places importance on hot carrier countermeasures. This is because the functions of the source region and the drain region do not change in the case of the above circuit group, and the carrier (electron) movement direction is fixed. However, $L_{ov}$ regions can be formed on both sides of the channel forming region so as in connection when necessary.

Further, the structure of the n-channel TFT 303 is suitable for a sampling circuit (sample hold circuit) which places importance on both hot carrier countermeasures and low off current operation. In other words, hot carrier countermeasures are realized by placement of the $L_{ov}$ region, and in addition, low off current operation is realized by placement of the $L_{off}$ region. Additionally, the functions of the source region and the drain region of the sampling circuit invert and the carrier movement direction changes by 180°, and therefore the structure must have linear symmetry with the gate wiring as a center. Note that it is possible to form only the $L_{ov}$ region depending upon the characteristic required of a TFT.

The structure of the n-channel TFT 304 of the pixel section is suitable for the sampling circuit (sample hold circuit), a pixel circuit which places importance on low off current operation. In other words, the $L_{ov}$ region, which can be a cause of increased off current value, is not formed, and low off current operation is realized by only forming the $L_{off}$ region. Furthermore, by using an n-type law concentration impurity region with a lower concentration of phosphorous than the n-type low concentration impurity region of the control circuit as the Loff region, even if the on current value falls by a small amount, it is possible to thoroughly reduce the off current value.

The length (width) of the $L_{ov}$ region 317 of the n-channel TFT 302 may be from 0.5 to 3.0 μm, typically between 1.0 and 1.5 μm, for channel length between 3 and 7 μm. Further, the length (width) of the $L_{ov}$ regions of the n-channel TFT 303 may be from 0.5 to 3.0 μm, typically between 1.0 and 1.5 μm, and the length (width) of the $L_{off}$ regions of the n-channel TFT 303 may be from 1.0 to 3.5 μm, typically between 1.5 and 2.0 μm. In addition, the length (width) of the $L_{off}$ regions 329 to 330 to be formed in the pixel TFT 304 may be from 0.5 to 3.5 μm, typically between 2.0 and 2.5 μm.

Further, by using an alumina film which has a high specific dielectric constant of 7 to 9 as the dielectric of the storage capacitor in the present embodiment, it is possible to reduce the surface area necessary to form the capacitor. In addition, by making the shielding film formed on the pixel TFT into one electrode of the storage capacitor, as in embodiment 4, the aperture ration of the image display section of the active matrix type liquid crystal display device can be increased.

Note that it is not necessary to place any limitations on the storage capacitor structure shown in embodiment 4 for the present invention. For example, the storage capacitor structures shown in Japanese Patent Application Laid-open No. Hei 11-133463 and Japanese Patent Application No. Hei 10-254097 according to the present applicant, can be used.

Embodiment 5

A process of manufacturing an active matrix type liquid crystal panel using an active matrix substrate is explained in embodiment 5.

As shown in FIG. 11, an orientation film 401 is formed on the active matrix substrate manufactured in accordance with the manufacturing processes of embodiment 4. A polyimide film is used as the orientation film in embodiment 5. Further, an opposing electrode 403 and an orientation film 404 are formed on an opposing substrate 402. Note that a color filter or a shielding film may be formed on the opposing substrate when necessary.

A rubbing process is performed next, aligning the liquid crystal atoms with a certain, fixed pre-tilt angle. The active matrix substrate, on which the pixel circuit and the control circuits are formed, and the opposing substrate are then joined through a sealing material or spacers (both not shown in the figure) by a known cell construction process. Afterward, a liquid crystal 405 is injected between the substrates, and this is sealed completely by a sealant (not shown in the figure). A known liquid crystal material may be used for the liquid crystal. The active matrix type liquid crystal display device shown in FIG. 11 is thus completed.

Figure 12:
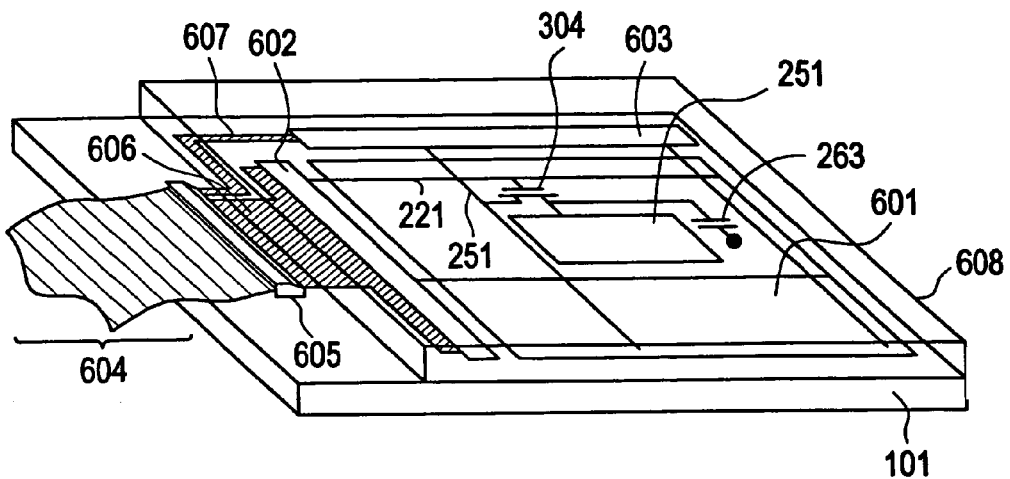
FIG. 12 is a schematic perspective view of the liquid crystal panel made into a module.

Next, the structure of the active matrix type liquid crystal display device is explained using the perspective view of FIG. 12. Note that in order to give correspondence with the cross sectional structure diagrams of FIGS. 8A to 10C, common symbols are used for FIG. 12. The active matrix substrate is structured by a pixel circuit 601, a scanning (gate) signal control circuit 602, and an image (source) signal control circuit 603 formed on the glass substrate 101. The pixel TFT 304 of the pixel circuit is an n-type TFT, and the control circuits formed in the periphery are structured with a CMOS circuit as a base. The scanning signal control circuit 602 and the image signal-control circuit 603 are connected to the pixel circuit 601 by the gate wiring 124 and the source wiring 152, respectively. Further, connection wirings 606 and 607 are formed from an external input/output terminal 605, which is connected to an FPC 604, to the input/output terminal of the control circuits.

Embodiment 6

Figure 13:
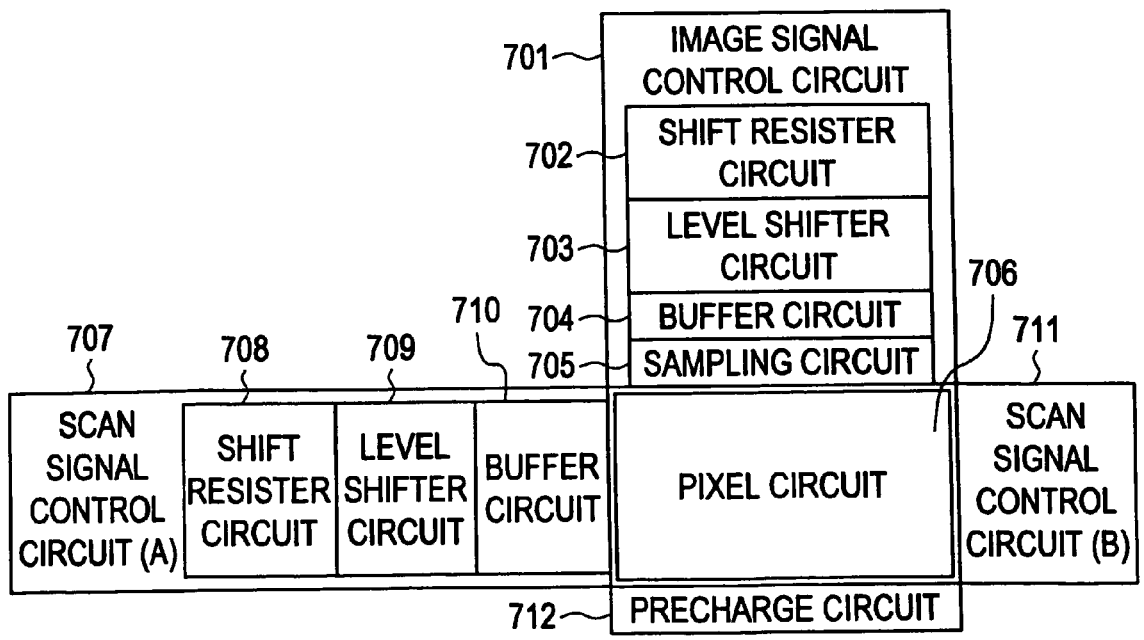
FIG. 13 is a block diagram of an active matrix substrate.

FIG. 13 shows an example of the circuit structure of the active matrix substrate shown in embodiment 4. The active matrix substrate of embodiment 6 has an image signal control circuit 701, a scanning signal control circuit (A) 707, a scanning signal control circuit (B) 711, a pre-charge circuit 712, and a pixel circuit 706. Note that control circuit is a generic term in this specification, and includes the image signal control circuit 701 and the scanning signal control circuit 707.

The image signal control circuit 701 is prepared with a shift register circuit 702, a level shifter circuit 703, a buffer circuit 704, and a sampling circuit 705. Further, the scanning signal control circuit (A) 707 is prepared with a shift register circuit 708, a level shifter circuit 709, and a buffer circuit 710. The scanning signal control circuit (B) is also structured similarly.

The drive voltage of the shift register circuits 702 and 708 is between 5 and 16 V here (typically 10 V), and the structure of the TFT 302 shown in embodiment 4 is suitable for the n-channel TFTs used in the CMOS circuits forming the circuits here.

Further, the drive voltage of the level shifter circuits 703 and 709, and of the buffer circuits 704 and 710, becomes high at between 14 and 16 V, and similar to the shift register circuits, CMOS circuits containing the n-channel TFT 302 shown in embodiment 4 are suitable. Note that making the gate wiring into a multi-gate structure such as a double gate structure, or a triple gate structure, is effective in raising the reliability of each circuit.

Figure 10A:
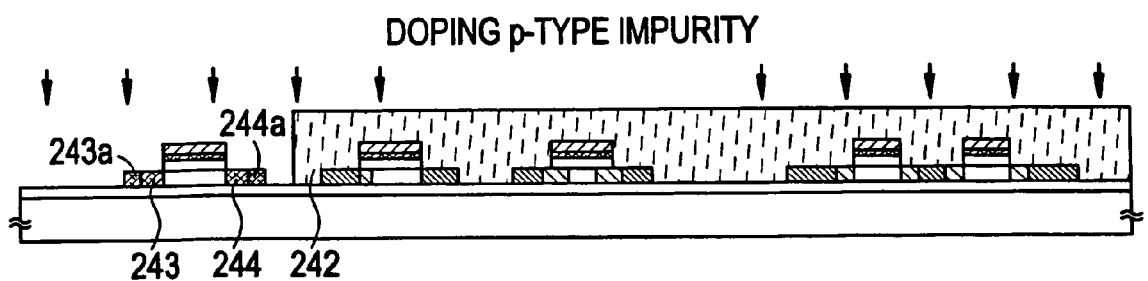
FIGS. 10A to 10C are cross sectional diagrams showing a manufacturing process of the TFT of the present invention.
Figure 10B:
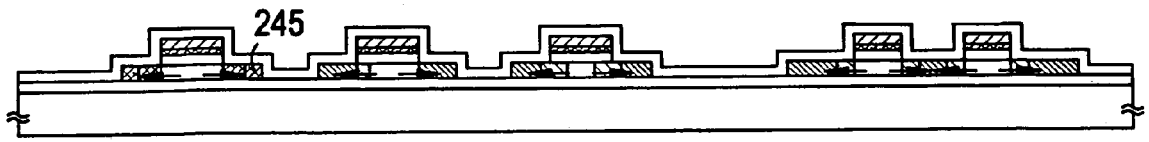
Figure 10C:
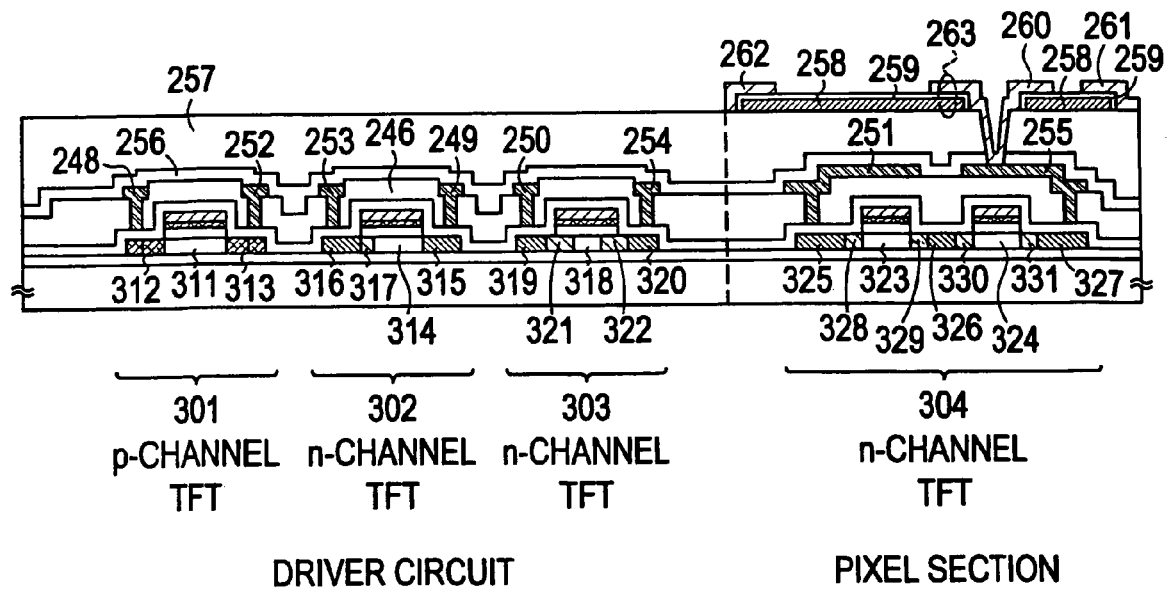

Further, the drive voltage of the sampling circuit 705 is from 14 to 16 V, and it is necessary to reduce the off current value because the source region and the drain region invert, and therefore a CMOS circuit containing the n-channel TFT 303 shown in embodiment 4 is suitable. Note that only an n-channel TFT is shown in FIG. 10C, but in practice an n-channel TFT and a p-channel TFT are combined and formed when forming the sampling circuit.

Furthermore, the drive voltage of the pixel circuit 706 is between 14 and 16 V, and an off current value even lower than that of the sampling circuit 705 is required, and therefore it is preferable to use a structure in which the $L_{ov}$ region is not formed. It is preferable to use the n-channel TFT 304 of FIG. 10C for the pixel TFT.

Note that the structure of embodiment 6 can easily be realized by manufacturing the TFTs in accordance with the manufacturing processes shown in embodiment 1. Further, a structure which has a pixel circuit and a control circuit is shown in embodiment 6, but it is possible to form other circuits such as a signal partitioning circuit, a frequency divider circuit, a D/A converter circuit, an op-amp circuit, a γ compensation circuit, and in addition, signal processing circuits (these may be called logic circuits) such as a memory circuit and a microprocessor circuit, on the same substrate in accordance with the manufacturing processes of embodiment 1.

Thus the present invention can realize a semiconductor device containing at least a pixel circuit and control circuits for controlling the pixel circuit, on the same substrate. For example, a semiconductor device which is prepared with a signal processing circuit, a control circuit, and a pixel circuit on the same substrate can be realized.

Embodiment 7

It is possible to use various liquid crystal materials in addition to TN liquid crystal in a liquid crystal display device manufactured in accordance with the present invention. For example, the liquid crystal materials disclosed in: H. Furue et al., "Characteristics and Driving Scheme of Polymer-stabilized Monostable FLCD Exhibiting Fast Response Time and High Contrast Ratio with Gray-scale Capability," SID, 1998; in T. Yoshida et al., "A Full-color Thresholdless Antiferroelectric LCD Exhibiting Wide Viewing Angle with Fast Response Time," SID 97 Digest, 841, 1997; S. Inui et al., "Thresholdless antiferroelectricity in liquid crystals and its application to displays, 671-673, J. Mater. Chem. 6(4), 1996; and in U.S. Pat. No. 5,594,569; can be used.

A liquid crystal that shows antiferroelectric phase in a certain temperature range is called an antiferroelectric liquid crystal. Among a mixed liquid crystal comprising antiferroelectric liquid crystal material, there is one called thresholdless antiferroelectric mixed liquid crystal that shows electrooptical response characteristic in which transmittivity is continuously varied against electric field. Among the thresholdless antiferroelectric liquid crystals, there are some that show V-shaped electrooptical response characteristic, and even liquid crystals whose driving voltage is approximately ±2.5 V (cell thickness approximately 1 μm to 2 μm) are found.

An example of light transmittivity characteristic against the applied voltage of thresholdless antiferroelectric mixed liquid crystal showing V-shaped electro-optical response characteristic, is shown in FIG. 14. The axis of ordinate in the graph shown in FIG. 14 is transmittivity (arbitrary unit) and the axis of the abscissas is the applied voltage. The transmitting direction of the polarizer on light incident side of the liquid crystal display is set at approximately parallel to direction of a normal line of the smectic layer of thresholdless antiferroelectric liquid crystal that approximately coincides with the rubbing direction of the liquid crystal display device. Further, the transmitting direction of the polarizer on the light radient side is set at approximately right angles (crossed Nicols) against the transmitting direction of the polarizer on the light incident side.

As shown in FIG. 14, it is seen that low voltage driving and gray scale display is available by using such thresholdless antiferroelectric mixed liquid crystal.

It becomes possible to reduce the power supply voltage of the sampling circuit for the image signal to for example approximately 5 to 8 V in case of using such low voltage driving thresholdless antiferroelectric mixed liquid crystal to a liquid crystal display device having an analog driver. Accordingly the operation power supply voltage for the driver can be reduced and low consumption electricity and high reliability of the liquid crystal display device can be attained.

Further, also in case of using the low voltage driving thresholdless antiferroelectric mixed liquid crystal to a liquid crystal display device having a digital driver, the operation power supply voltage of the D/A converter circuit can be lowered because the output voltage of the D/A converter circuit can be lowered, and the operation power voltage of the driver can be lowered. Accordingly, low consumption electricity and high reliability of the liquid crystal display device can be attained.

Therefore the use of such low voltage driving thresholdless antiferrelectric mixed liquid crystal is effective in case of using a TFT having a relatively small LDD region (low concentration impurity region) width (for instance 0 to 500 nm, or 0 to 200 nm).

Further, thresholdless antiferroelectric mixed liquid crystal has large spontaneous polarization in general, and the dielectric constant of the liquid crystal itself is large. Therefore, comparatively large storage capacitor is required in the pixel in case of using thresholdless antiferroelectric mixed liquid crystal for a liquid crystal display device. It is therefore preferable to use thresholdless antiferroelectric mixed liquid crystal having small spontaneous polarity. It is also acceptable to compensate a small storage capacitor by lengthening a writing period of gray scale voltage to the pixel (pixel field period) by applying line sequential driving method as the driving method of the liquid crystal display device.

A low consumption electricity of a liquid crystal display is attained because low voltage driving is realized by the use of such thresholdless antiferroelectric mixed liquid crystal.

Further, any of liquid crystal display can be used as a display medium of the liquid crystal display device of the present invention on condition that the liquid crystal has an electro-optical characteristic shown in FIG. 14.

Embodiment 8

It is possible to apply the manufacturing method for TFTs of Embodiment 4 to manufacture of active matrix EL display. An example is shown in FIGS. 15A to 17B.

An example of manufacturing an EL (electro-luminescence) display device by using the present invention is described in the present Embodiment. Note that FIG. 15A is a top view of an EL display device of the present invention and FIG. 15B shows its cross sectional structure.

Figure 15A:
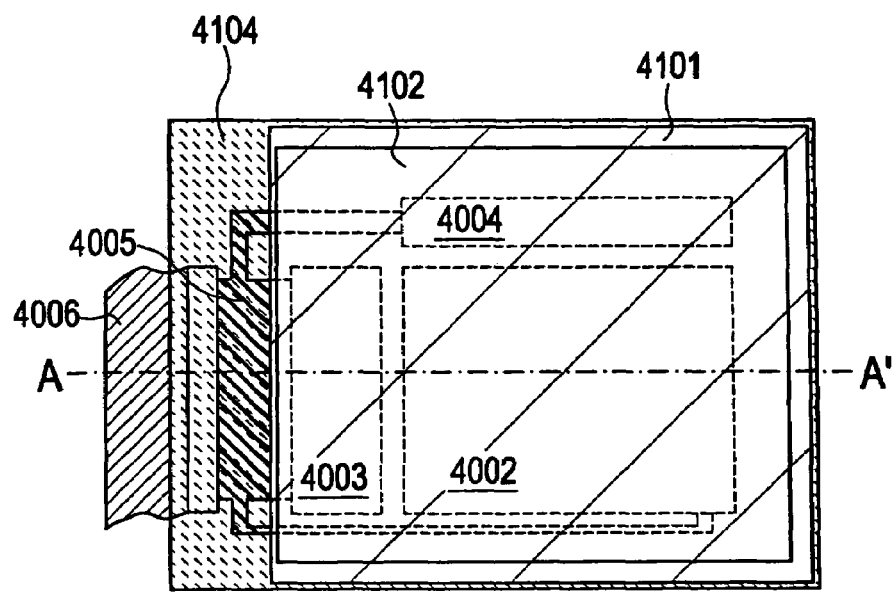
FIGS. 15A and 15B are a top view and a cross sectional diagram, respectively, of an EL display device of the present invention.

In FIG. 15A: reference numeral 4001 denotes a substrate; 4002, a pixel section; 4003, a source side driver circuit; 4004, a gate side driver circuit. Each driver circuit reaches FPC (flexible print circuit) 4006 through wiring 4005, and then connected to external machines.

Here, a first sealing material 4101, a cover material 4102, a filling material 4103 and second sealing material 4104 are disposed to surround a pixel section 4002, a source side driver circuit 4003 and a gate side driver circuit 4004.

Figure 15B:
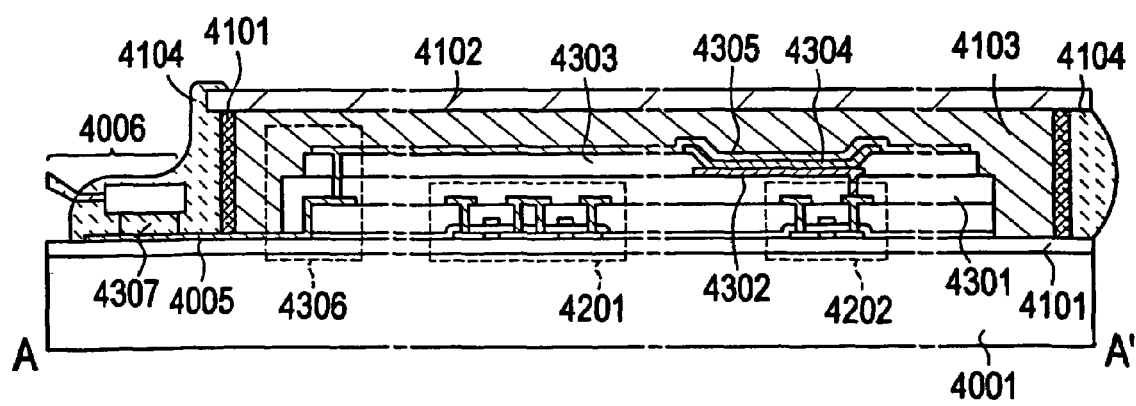

Further, FIG. 15B corresponds to a cross-sectional diagram at A-A' of FIG. 15A. A driver TFT 4201 which comprises a source side driver circuit 4003 (note that an n-channel TFT and a p-channel TFT are shown in the figure) and a current control TFT (a TFT which controls electric current that flows into an EL element) 4202 which comprises the pixel section 4002 are formed over a substrate 4001.

In the present embodiment a TFT having the same structure as a p-channel TFT or an n-channel TFT in FIG. 11 is used for a driver TFT 4201 and a TFT having the same structure as a p-channel TFT in FIG. 11 is used for a current control TFT 4202. Further, a storage capacitor (not shown) which is connected to the gate of a current control TFT 4202 is disposed in the pixel section 4002.

An interlayer insulating film (flattening film) 4301 comprising a resin material is formed over a driver TFT 4201 and a pixel TFT 4202, and a pixel electrode (anode) 4302 that is electrically connected to the drain of a pixel TFT 4202 is formed thereon. As a pixel electrode 4302, a transparent conductive film which has a large work function is used. A compound of indium oxide and tin oxide, a compound of indium oxide and zinc oxide, zinc oxide, tin oxide or indium oxide can be used as the transparent conductive film. In addition, a material added with gallium to the above stated transparent conductive film may also be used.

An insulating film 4303 is formed on the pixel electrode 4302 and an opening section is formed in the insulating film 4303 at above the pixel electrode 4302. In this opening section an EL (electro-luminescence) layer 4304 is formed over the pixel electrode 4302. A known organic or inorganic EL material can be used for the EL layer 4304. Further though there are small molecular materials and polymer materials in the organic EL materials, either may be used.

A known evaporation technique or a coating technique may be used for the formation method of the EL layer 4304. Further, the structure of EL layer may be a laminate structure or a single layer structure by freely combining a hole injection layer, a hole transport layer, a light emitting layer, an electron transport layer or an electron injection layer.

A cathode 4305 comprising a conductive film containing an element which belongs to group 1 or 2 of the periodic table (typically a conductive film in which alkali metal element or alkali earth metal element is contained in aluminum, copper or silver) is formed over EL layer 4304. It is preferable to avoid as much as possible of moisture and oxygen that exist in the interface between the cathode 4305 and the EL layer 4304. Accordingly measures such as successive deposition of the two in a vacuum, or forming EL layer 4304 in a nitrogen or noble gas atmosphere and then forming cathode 4305 without contact to oxygen and moisture, are required. In the present embodiment the deposition described above is made possible by using a deposition apparatus such as a multi-chamber system (cluster-tool system).

The cathode 4305 is electrically connected to the wiring 4005 in a region denoted by reference numeral 4306. Wiring 4005 is a wiring for applying preset voltage to the cathode 4305 and is electrically connected to FPC 4006 through an isotropic conductive film 4307.

Thus an EL element which comprises a pixel electrode (anode) 4302, an EL layer 4304 and a cathode 4305 is formed. The EL elements are surrounded by first sealing material 4101 and a cover material 4102 which is stuck to a substrate 4001 by the first sealing material 4101 and sealed by filling material 4103.

As the cover material 4102, a glass material, a metallic material (typically stainless steel), a ceramics material and a plastic material (including a plastic film) can be used. As a plastic material, FRP (fiberglass-reinforced plastics) plate, PVF (polyvinyl fluoride) film, Myler film, polyester film or acrylic resin film can be used. Further, a sheet having a structure in which aluminum foil is sandwiched by PVF film or Myler film can be used.

Note however, the cover material need to be transparent in case that radiation from EL elements are directed to the direction toward cover material. In such cases, a transparent substance such as a glass plate, a plastic plate, a polyester film or an acrylic film is used.

A ultraviolet ray curing resin or a thermosetting resin can be used as filling material 4103, and PVC (polyvinyl chloride), acrylic, polyimide, epoxy resin, silicone resin, PVB (polyvinyl butyral), or EVA (ethylene vinyl acetate) can be used. If a drying agent (preferably barium oxide) is formed on the inside of the filling material 4103, deterioration of EL elements can be prevented.

Further, spacers may be included within the filling material 4103. When the spacers are formed from barium oxide, it is possible to give the ability to absorb moisture to the spacers themselves. In addition, it is effective to provide a resin film over cathode 4305, as a buffer layer that releases pressure from the spacers in case of disposing the spacers.

The wiring 4005 is electrically connected to the FPC 4006 through anisotropic conductive film 4307. Wiring 4005 transmits signals that are sent to pixel section 4002, source side driver circuit 4003 and gate side driver circuit 4004 to FPC 4006, and is electrically connected to an external device by FPC 4006.

In the present embodiment a structure that thoroughly shields the EL elements from external atmosphere is employed in which second sealing material 4104 is provided so as to cover the exposed portions of first sealing material 4101 and a part of FPC 4006. An EL display device having the cross sectional structure of FIG. 15B is thus complete.

Figure 16:
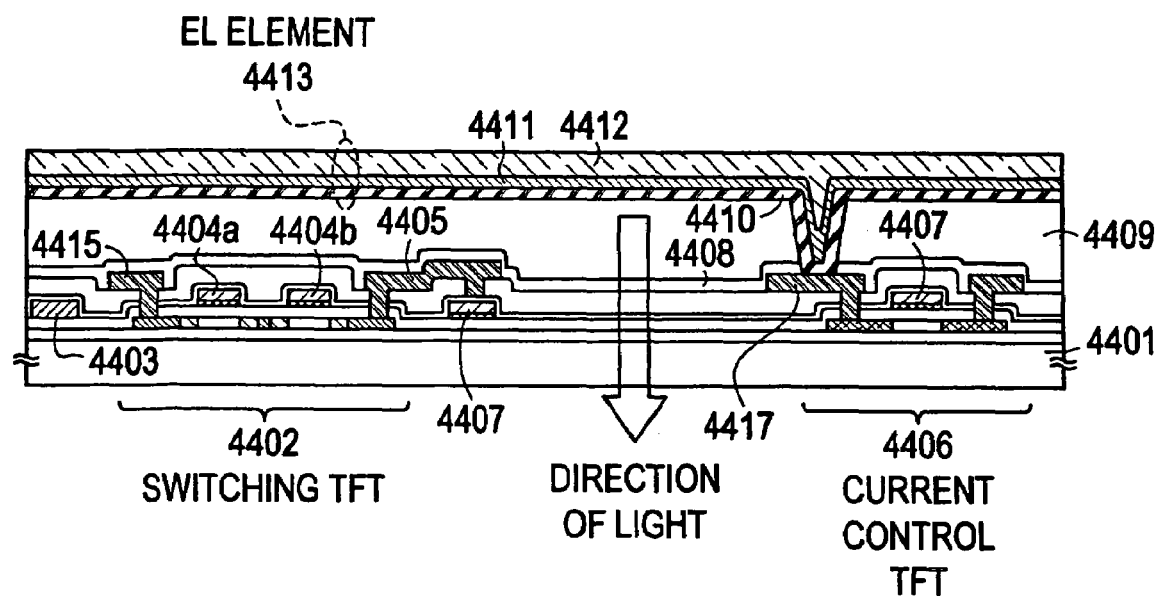
FIG. 16 is a cross sectional diagram of a pixel section of the EL display device of the present invention.
Figure 17A:
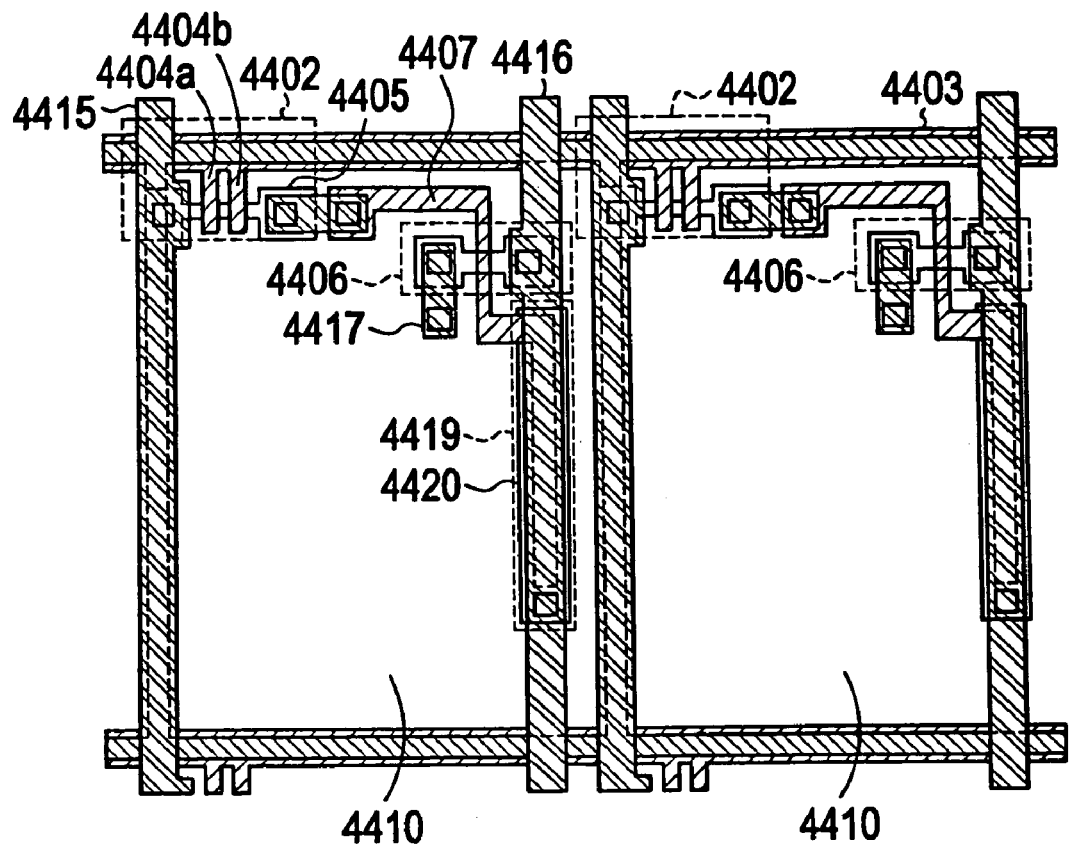
FIGS. 17A and 17B are a top view and a circuit diagram, respectively, of the pixel section of the EL display device of the present invention.
Figure 17B:
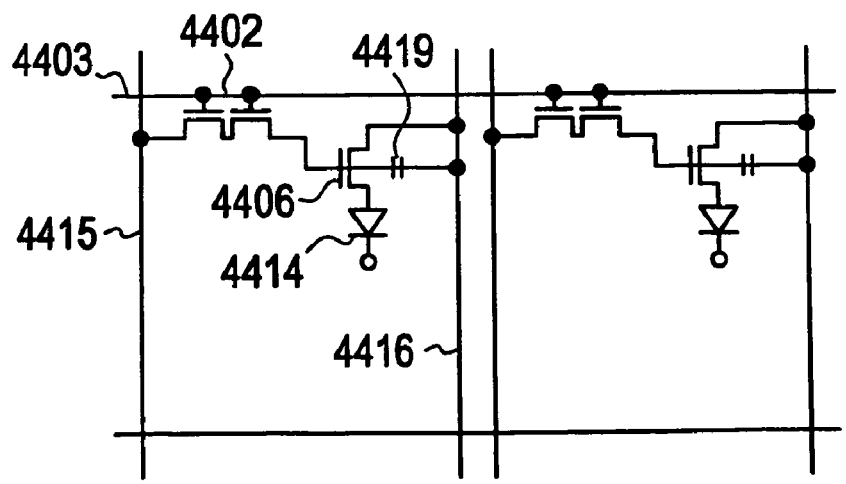

A more detailed structure on a cross section of pixel section is shown in FIG. 16, a top view is shown in FIG. 17A, and circuit diagram is shown in FIG. 17B. Common reference numerals are used in FIGS. 16, 17A and 17B, so that the figures may be compared with each other.

In FIG. 16, switching TFT 4402 disposed over substrate 4401 is formed from an n-channel TFT 304 of FIG. 11. Accordingly, the description of n-channel TFT 304 of FIG. 11 may be referred regarding the structure of the TFT 4402. The wiring shown by 4403 is a gate wiring that electrically connects gate electrodes 4404*a* and 4404*b* of switching TFT 4402.

Note that while the present invention uses a double gate structure in which 2 channel forming regions are formed, single gate structure in which one channel forming region is formed or a triple gate structure in which 3 channel forming regions are formed are also acceptable.

The drain wiring 4405 of switching TFT 4402 is electrically connected to gate electrode 4407 of current control TFT 4406. Note that current control TFT 4406 is formed from a p-channel TFT 301 of FIG. 11. Accordingly, the description of the p-channel TFT 301 of FIG. 11 may be referred regarding the description of the structure. Note that while the present embodiment uses a single gate structure, a double gate structure or a triple gate structure are also acceptable.

A first passivation film 4408 is disposed over the switching TFT 4402 and the current control TFT 4406, and a planarization film 4409 comprising resin is formed on top. It is very important to flatten by using the planarization film 4409, the step due to the TFTs. Since an EL layer formed later is extremely thin, there are cases in which defective luminescence is caused due to the existence of the step. Therefore, it is preferable to planarize before forming pixel electrode so as to form an EL layer on a planarized surface as possible.

The reference numeral 4410 denotes a pixel electrode (anode of EL element) comprising a transparent conductive film, and is electrically connected to the drain wiring 4417 of current control TFT 4406. A compound of indium oxide and tin oxide, a compound of indium oxide and zinc oxide, zinc oxide, tin oxide or indium oxide can be used as the transparent conductive film. Further, said conductive transparent including gallium may also be used.

An EL layer 4411 is formed on pixel electrode 4410. Note that while FIG. 16 shows only 1 pixel, EL layers corresponding to each colors of R (red), G (green) and B (blue) are each formed properly in the present embodiment. A small molecular type organic EL material is formed by evaporation in the present embodiment. In concrete, a laminate structure is formed from a copper phthalocyanine (CuPc) film of 20 nm thickness disposed as a hole injection layer, and tris-8-quinolinolate aluminum complex ($Alq_3$) film formed thereon into 70 nm thickness as a luminescent layer. A luminescent color may be controlled by adding fluorescent dye such as quinacridon, Perylene or DCM1 into $Alq_3$.

However, the above example is one example of the organic EL materials that can be used as luminescence layers, and it is not necessary to limit to these materials. An EL layer (a layer for luminescence and for performing carrier motion for luminescence) may be formed by freely combining luminescence layer, charge transport layer, or charge injection layer. For example, an example using small molecular type materials as luminescence layers is shown in the present embodiment, but polymer type organic EL materials may also be used. Further, it is possible to use inorganic materials such as silicon carbide, etc., as charge transport layer and charge injection layer. Publicly known materials can be used for these organic EL materials and inorganic materials.

A cathode 4412 comprising a conductive film is next formed on EL layer 4411. In the case of the present embodiment, an alloy film of aluminum and lithium is used as the conductive film. Needless to say, a publicly known MgAg film (alloy film of magnesium and silver) may also be used. As the cathode material, a conductive film comprising an element belonging to periodic table group 1 or 2, or a conductive film added with at least one of these elements, may be used.

EL element 4413 is completed at the point when this cathode 4412 is formed. Note that an EL element 4413 formed here represents a capacitor formed from pixel electrode (anode) 4410, EL layer 4411 and cathode 4412.

The top view of the pixel in the present embodiment is next described by using FIG. 17A. Source region of switching TFT 4402 is connected to source wiring 4415 and drain region is connected to drain wiring 4405. Further, drain wiring 4405 is electrically connected to gate electrode 4407 of current control TFT 4406. Source region of current control TFT 4406 is electrically connected to current supply line 4416 and drain region is electrically connected to drain wiring 4417. Drain wiring 4417 is electrically connected to pixel electrode (anode) 4410 shown by dotted line.

Here, a storage capacitor is formed in the region shown by 4419. Storage capacitor 4419 is formed from a semiconductor film 4420 electrically connected to current supply line 4416, an insulating film formed of the same layer as gate insulating film (not shown) and gate electrode 4407. Further, it is possible to use a capacitance formed from gate electrode 4407, a layer formed from the same layer as the first interlayer insulating film (not shown) and current supply line 4416, for a storage capacitor.

Embodiment 9

Figure 18:
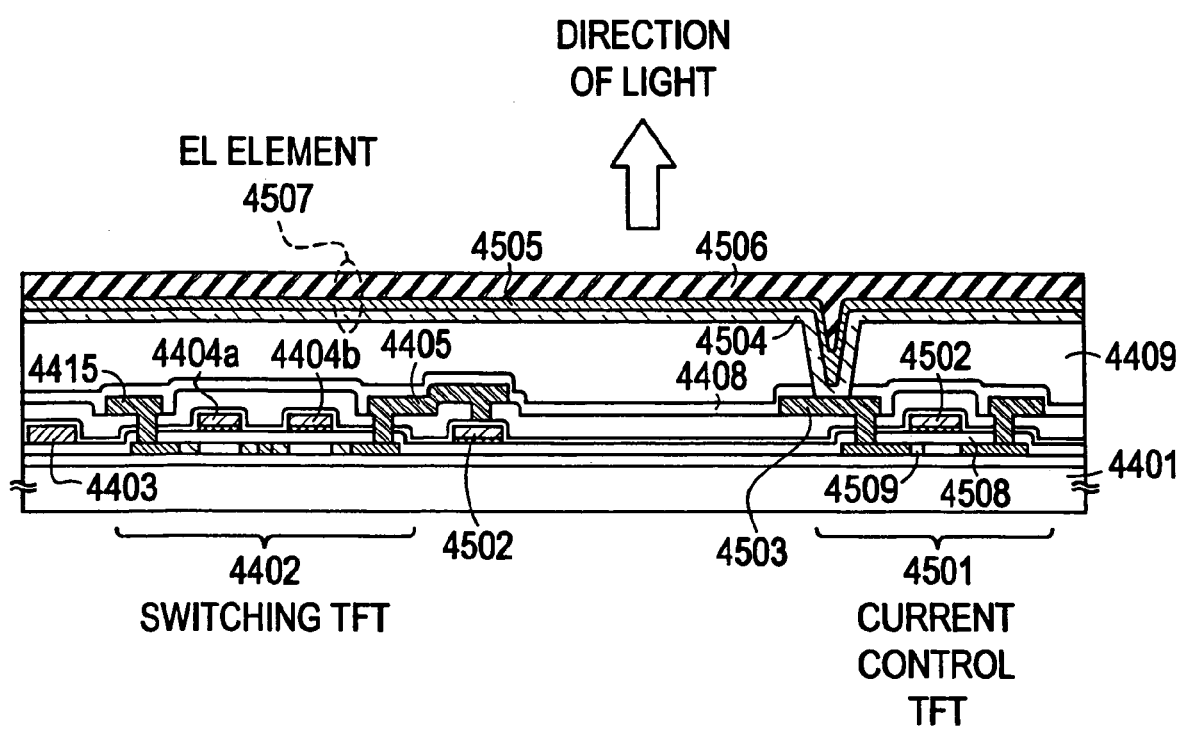
FIG. 18 is a cross sectional diagram of the EL display device of the present invention.

In embodiment 9 an EL display device having a pixel structure differing from embodiment 8 is described. FIG. 18 is used for explanation. Note that the description of embodiment 8 may be referred regarding parts where the same reference numerals as FIG. 17 are given.

In FIG. 18 a TFT having the same structure as n-channel TFT 302 of FIG. 11 is used as current control TFT 4501. Needless to say, gate electrode 4502 of current control TFT 4501 is electrically connected to drain wiring 4405 of switching TFT 4402. Drain wiring 4503 of current control TFT 4501 is electrically connected to pixel electrode 4504.

In embodiment 9, a pixel electrode 4504 comprising a conductive film functions as a cathode of the EL element. An alloy film of aluminum and lithium is used in concrete, but a conductive film comprising an element belonging to periodic table group 1 or 2, or a conductive film added with such element may be used here.

EL layer 4505 is formed on top of pixel electrode 4504. Note that though FIG. 18 shows only 1 pixel, EL layer corresponding to G (green) is formed in the present embodiment by evaporation method or coating method (preferably spin coating). In concrete, it is a laminate structure comprising a lithium fluoride (LiF) film of 20 nm thickness provided as electron injection layer and a PPV (poly-p-phenylene vinylene) of 70 nm thickness provided thereon as luminescence layer.

An anode 4506 comprising transparent conductive film is next disposed on EL layer 4505. In the present embodiment, a compound of indium oxide and tin oxide or a compound of indium oxide and zinc oxide is used as the transparent conductive film.

On completing formation of anode 4506, an EL element 4507 is finished. Note that EL element 4507 represents here a capacitor formed from pixel electrode (cathode) 4504, EL layer 4505 and anode 4506.

Degradation due to hot carrier effect is actualized in a current control TFT 4501 in case that the voltage applied to the EL element is such a high voltage as exceeding 10V. It is effective to use an n-channel TFT having a structure of the present invention as the current control TFT 4501.

Note that, the current control TFT 4501 of the present embodiment forms a parasitic capacitance, which is referred to as gate capacitance, in between gate electrode 4502 and LDD regions 4509. It is possible to provide the same function as storage capacitor 4419 shown in FIGS. 17A and 17B by adjusting this gate capacitance. Specifically in case of driving the EL display device by digital driving method, it is possible to use the gate capacitance for storage capacitor because the capacitance of storage capacitor can be smaller compared to the case of driving by analog driving method.

Note that an n-channel TFT having a structure in which LDD region 4509 is omitted from the structure shown in FIG. 18 may be used in case the voltage applied to an EL element is less than 10V preferably less than 5V because above stated degradation due to hot carrier effect would not become a serious problem.

Embodiment 10

Figure 19A:
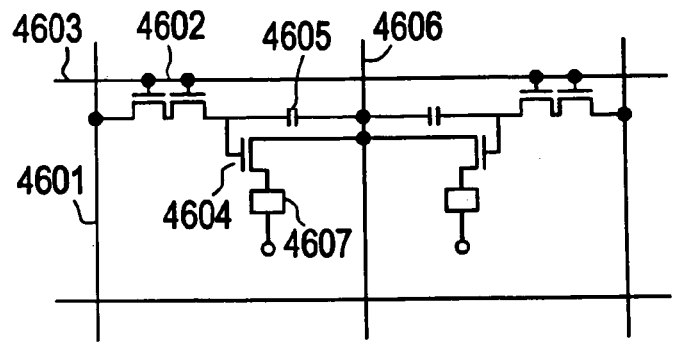
FIGS. 19A to 19C are circuit diagrams of the pixel section of the EL display device of the present invention.
Figure 19B:
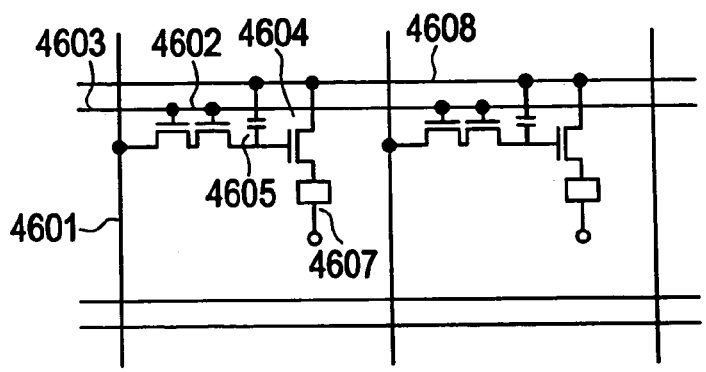
Figure 19C:
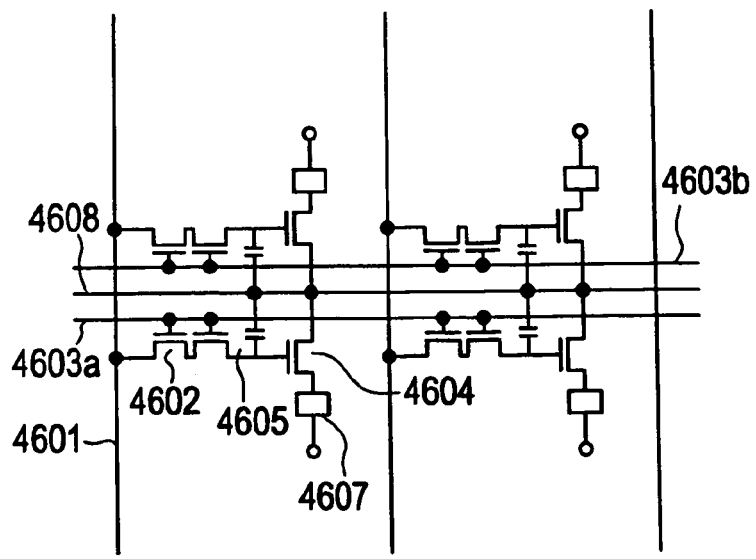

In embodiment 10, examples of the pixel structure of the EL display device shown in embodiment 8 or embodiment 9 are shown in FIGS. 19A to 19C. Note that in embodiment 10, reference numeral 4601 denotes a source wiring of a switching TFT 4602, reference numeral 4603 denotes a gate wiring of the switching TFT 4602, reference numeral 4604 denotes a current control TFT, 4605 denotes a capacitor, 4606 and 4608 denote electric current supply lines, and 4607 denotes an EL element.

FIG. 19A is an example of a case in which the electric current supply line 4606 is common between two pixels. Namely, this is characterized in that the two pixels are formed in a linearly symmetrical manner with the electric current supply line 4606 as a center. In this case, the number of electric current supply lines can be reduced, and therefore the pixel section can be made even more high definition.

Further, FIG. 19B is an example of a case in which the electric current supply line 4608 is formed parallel to the gate wiring 4603. Note that in FIG. 19B, the structure is formed such that the electric current supply line 4608 and the gate wiring 4603 do not overlap, but provided that both are wirings formed on different layers, then they can be formed to overlap through an insulating film. In this case, the exclusive surface area of the electric current supply line 4608 and the gate wiring 4603 can be shared, and the pixel section can be made even more high definition.

Furthermore, FIG. 19C is characterized in that the electric current supply line 4608 and the gate wiring 4603 are formed in parallel, similar to the structure of FIG. 19B, and additionally, in that the two pixels are formed in a linearly symmetrical manner with the electric current supply line 4608. In addition, it is effective to form the electric current supply line 4608 so as to overlap with one of the gate wirings 4603. In this case, the number of electric current supply lines can be reduced, and therefore the pixel section can be made even more high definition.

Embodiment 11

Figure 20A:
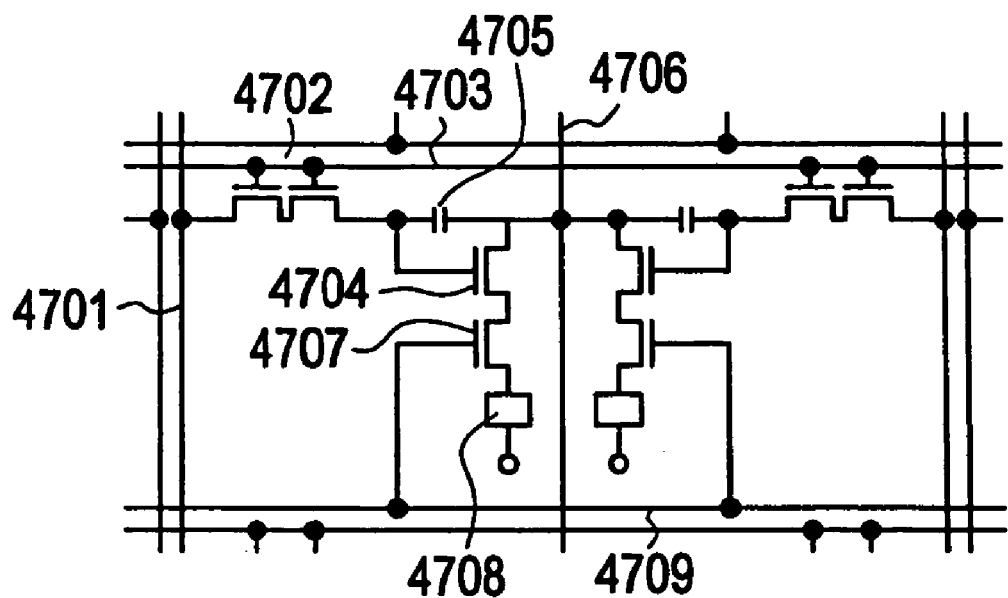
FIGS. 20A and 20B are circuit diagrams of the pixel section of the EL display device of the present invention.
Figure 20B:
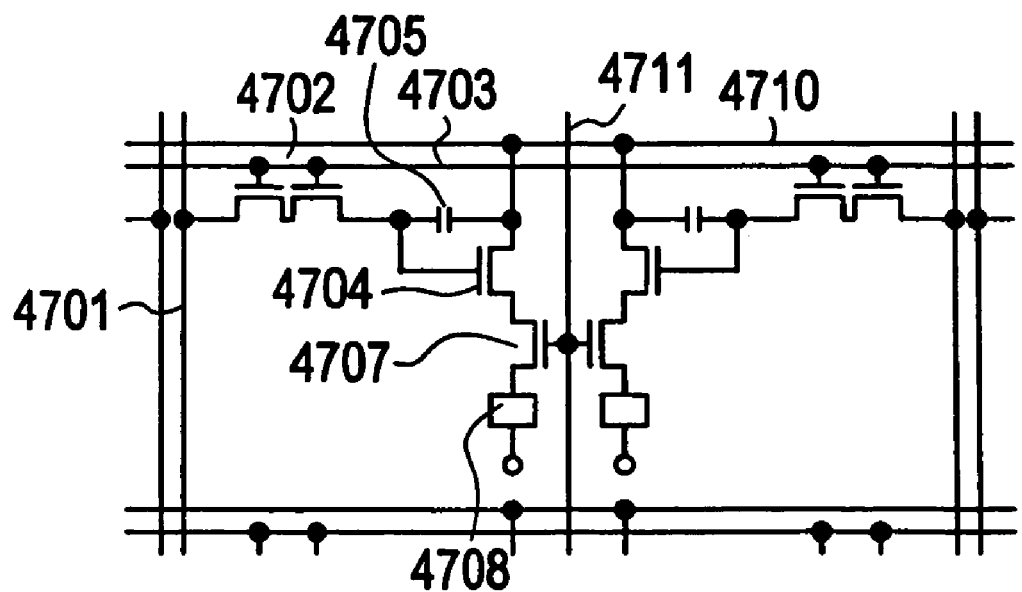

In embodiment 11, examples of the pixel structure of the EL display device of the present invention are shown in FIGS. 20A and 20B. Note that in embodiment 11, reference numeral 4701 denotes a source wiring of a switching TFT 4702, reference numeral 4703 denotes a gate wiring of the switching TFT 4702, reference numeral 4704 denotes a current control TFT, 4705 denotes a capacitor (it is possible to omit the capacitor), 4706 denotes an electric current supply line, 4707 denotes a power source control TFT, 4709 denotes a power source control gate wiring, and 4708 denotes an EL element. Japanese Patent Application Laid-open No. Hei 11-341272 (not yet published) may be referred to regarding the operation of the power source control TFT 4707.

Further, the power source control TFT 4707 is formed between the current control TFT 4704 and the EL element 4708 in embodiment 11, but a structure in which the current control TFT 4704 is formed between the power source TFT 4707 and the EL element 4708 may also be used. Furthermore, it is preferable to either make the power source control TFT 4707 in the same structure as the current control TFT 4704, or to form them in series on the same active layer.

FIG. 20A is an example of a case in which the electric current supply line 4706 is common between two pixels. Namely, this is characterized in that the two pixels are formed in a linearly symmetrical manner with the electric current supply line 4706 as a center. In this case, the number of electric current supply lines can be reduced, and therefore the pixel section can be made even more high definition.

In addition, FIG. 20B is an example of a case in which an electric current supply line 4710 is formed parallel to the gate wiring 4703, and in which a power source control gate wiring 4711 is formed parallel to the source wiring 4701. Note that in FIG. 20B, the structure is formed such that the electric current supply line 4710 and the gate wiring 4703 do not overlap, but provided that both are wirings formed on different layers, then they can be formed to overlap through an insulating film. In this case, the exclusive surface area of the electric current supply line 4710 and the gate wiring 4703 can be shared, and the pixel section can be made even more high definition.

Embodiment 12

Figure 21A:
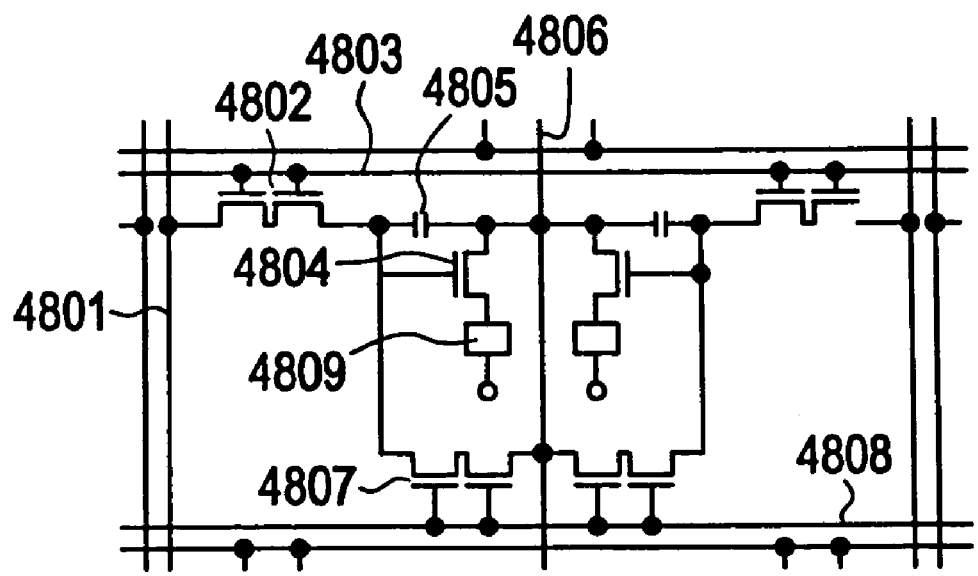
FIGS. 21A and 21B are circuit diagrams of the pixel section of the EL display device of the present invention.
Figure 21B:
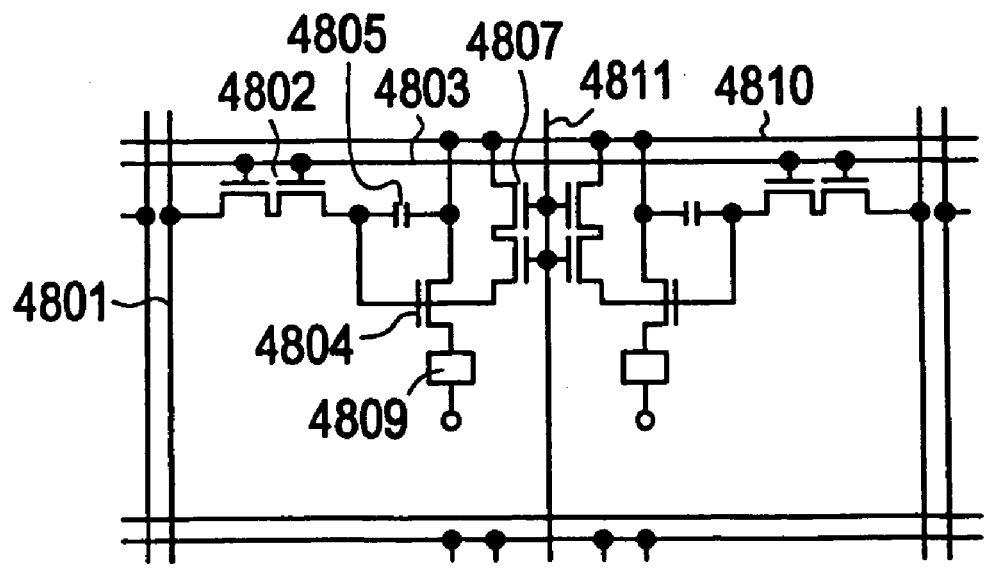

In embodiment 12, examples of the pixel structure of the EL display device of the present invention are shown in FIGS. 21A and 21B. Note that in embodiment 12, reference numeral 4801 denotes a source wiring of a switching TFT 4802, reference numeral 4803 denotes a gate wiring of the switching TFT 4802, reference numeral 4804 denotes a current control TFT, 4805 denotes a capacitor (it is possible to omit the capacitor), 4806 denotes an electric current supply line, 4807 denotes an erasure TFT, 4808 denotes an erasure gate wiring, and 4809 denotes an EL element. Japanese Patent Application Laid-open No. Hei 11-338786 (not published yet) may be referred to regarding the operation of the erasure TFT 4807.

The drain of the erasure TFT 4807 is connected to a gate of the current control TFT 4804, and it becomes possible to forcibly change the gate voltage of the current control TFT 4804. Note that an n-channel TFT or a p-channel TFT may be used for the erasure TFT 4807, but it is preferable to make it the same structure as the switching TFT 4802 so that the off current can be made smaller.

FIG. 21A is an example of a case in which the electric current supply line 4806 is common between two pixels. Namely, this is characterized in that the two pixels are formed in a linearly symmetrical manner with the electric current supply line 4806 as a center. In this case, the number of electric current supply lines can be reduced, and therefore the pixel section can be made even more high definition.

In addition, FIG. 21B is an example of a case in which an electric current supply line 4810 is formed parallel to the gate wiring 4803, and in which an erasure gate wiring 4811 is formed parallel to the source wiring 4801. Note that in FIG. 21B, the structure is formed such that the electric current supply line 4810 and the gate wiring 4803 do not overlap, but provided that both are wirings formed on different layers, then they can be formed to overlap through an insulating film. In this case, the exclusive surface area of the electric current supply line 4810 and the gate wiring 4803 can be shared, and the pixel section can be made even more high definition.

Embodiment 13

A structure in which several TFTs are formed within a pixel may be used for the EL display device of the present invention. For example, a structure of from four to six, or more, TFTs may be formed. It is possible to implement the present invention without placing limits on the pixel structure of the EL display device.

Embodiment 14

The present invention can be applied to all of the electronic devices incorporating an active matrix display device fabricated by implementing the present invention as a display medium, for example, a liquid crystal panel shown in Embodiment 5 and an organic EL display shown in Embodiment 8-13.

Following can be given as such electronic devices: video cameras; digital cameras; projectors (rear type or front type); head mounted displays (goggle type displays); car navigation systems; personal computers; portable information terminals (mobile computers, portable telephones or electronic books etc.) etc. Examples of these are shown in FIGS. 22A to 23D.

Figure 22A:
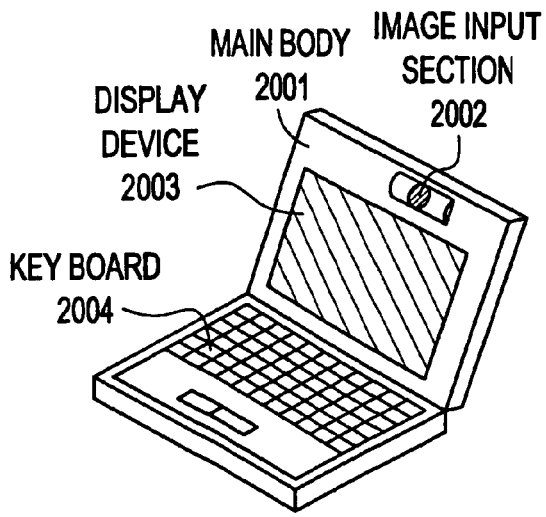
FIGS. 22A to 22F are examples of electronic equipment applications.

FIG. 22A is a personal computer which comprises: a main body 2001; an image input section 2002; a display device 2003; and a key board 2004. The present invention can be applied to the image input section 2002, the display device 2003 and other signal control circuits.

Figure 22B:
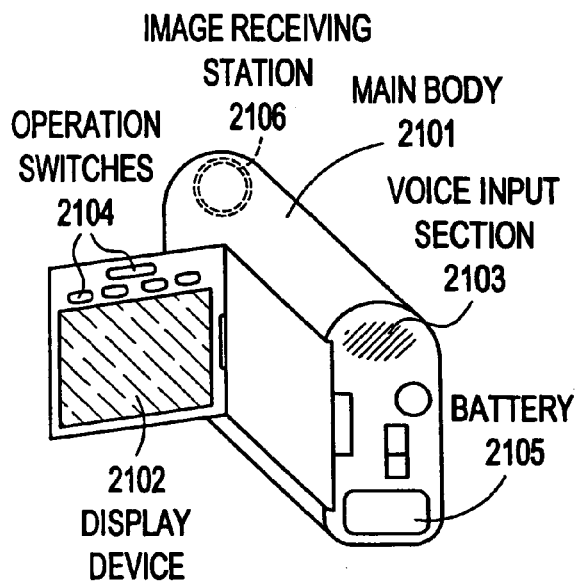

FIG. 22B is a video camera which comprises: a main body 2101; a display device 2102, a voice input section 2103; operation switches 2104; a battery 2105 and an image receiving section 2106. The present invention can be applied to the display device 2102, the voice input section 2103 and other signal control circuits.

Figure 22C:
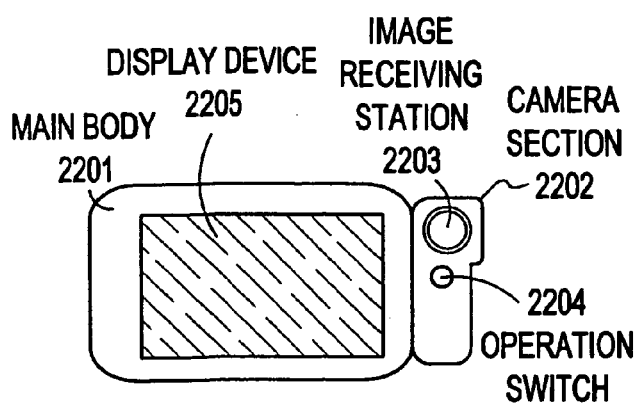

FIG. 22C is a mobile computer which comprises: a main body 2201; a camera section 2202; an image receiving section 2203; operation switches 2204 and a display device 2205. The present invention can be applied to the display device 2205 and other signal control circuits.

Figure 22D:
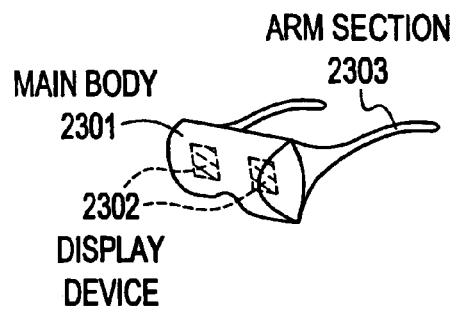

FIG. 22D is a goggle type display which comprises: a main body 2301; a display device 2302; and an arm section 2303. The present invention can be applied to the display device 2302 and other signal control circuits.

Figure 22E:
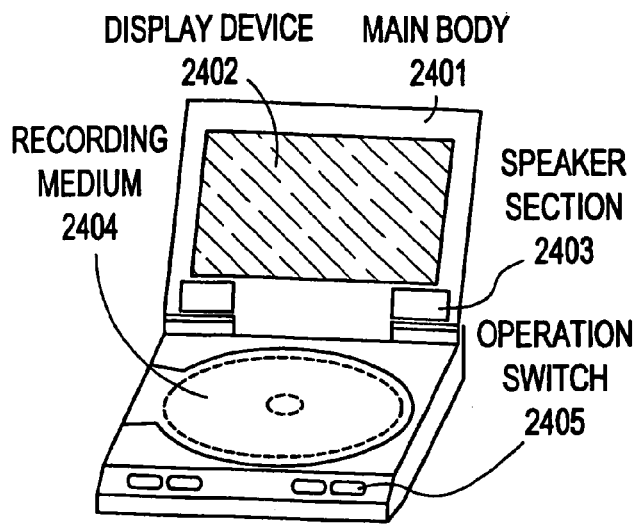

FIG. 22E is a player using a recording medium which records a program (hereinafter referred to as a recording medium) which comprises: a main body 2401; a display device 2402; a speaker section 2403; a recording medium 2404; operation switches 2405 and external input section (not shown in the figure). This device uses DVD (digital versatile disc), CD, etc. for the recording medium, and can be used for music appreciation, film appreciation, games and Internet. The present invention can be applied to the display device 2402 and other signal control circuits.

Figure 22F:
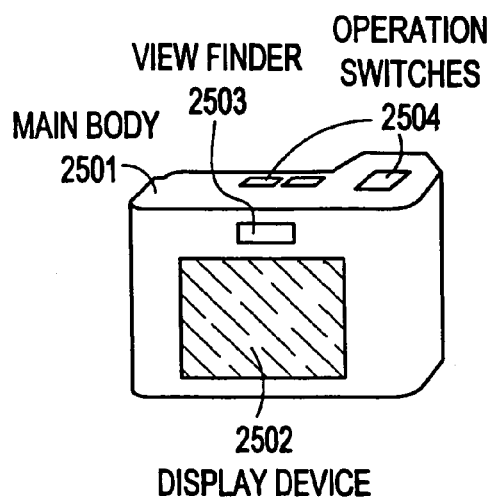

FIG. 22F is a digital camera which comprises: a main body 2501; a display device 2502; a view finder 2503; operation switches 2504; and an image receiving section (not shown in the figure). The present invention can be applied to the display device 2502 and other signal control circuits.

Figure 23A:
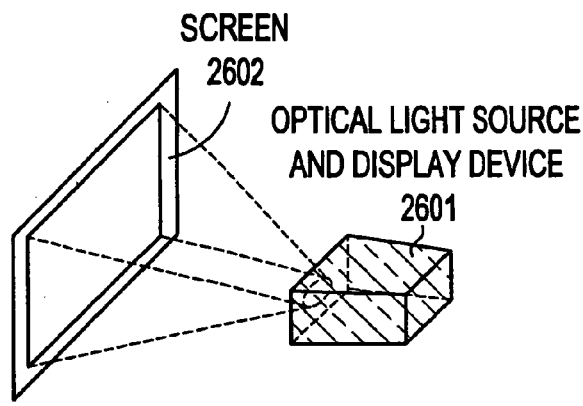
FIGS. 23A to 23D are examples of applications to projectors.

FIG. 23A is a front type projector which comprises: an optical light source system and a display device 2601; and a screen 2602. The present invention can be applied to the display device and other signal control circuits.

Figure 23B:
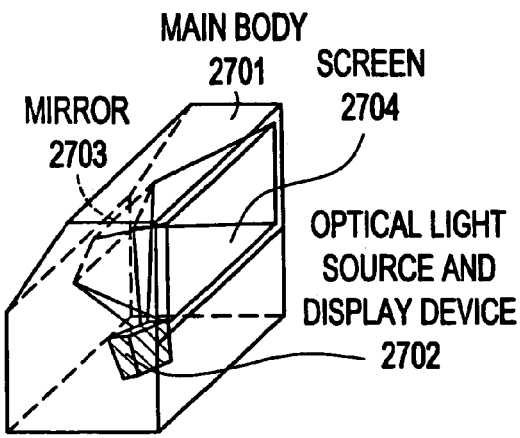

FIG. 23B is a rear type projector which comprises: a main body 2701; an optical light source system and a display device 2702; a mirror 2703; and a screen 2704. The present invention can be applied to the display device and other signal control circuits.

Figure 23C:
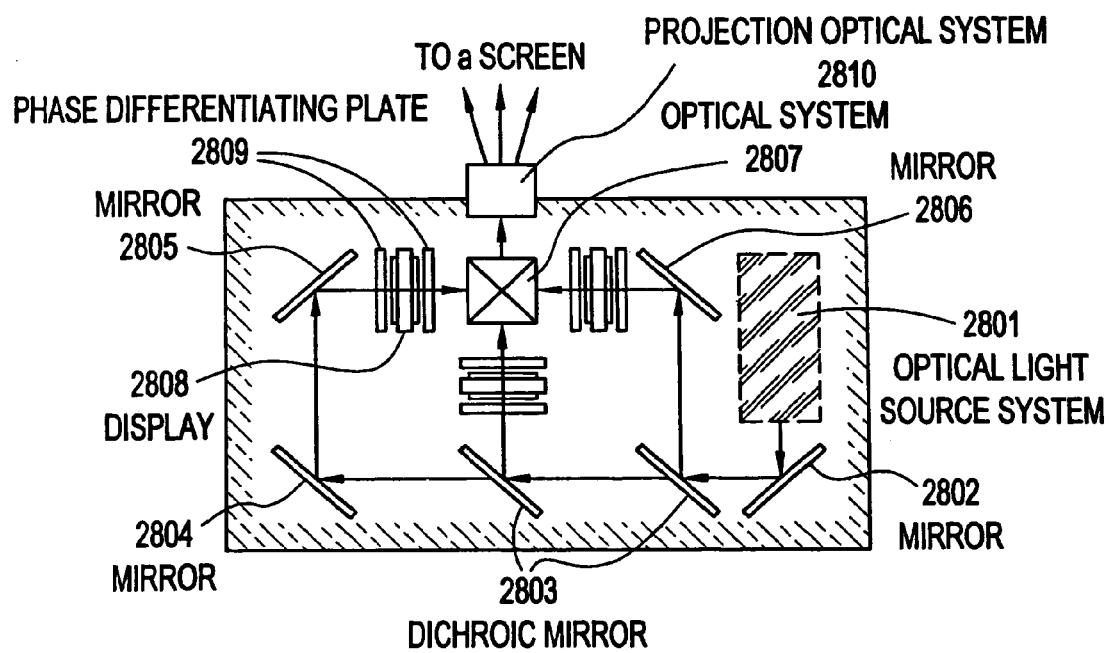

FIG. 23C is a diagram which shows an example of the structure of the optical light source system and display devices 2601 and 2702 of FIGS. 23A and 23B. Each of the optical light source system and display device 2601 and 2702 comprises: an optical light source system 2801; mirrors 2802 and 2804 to 2806; a dichroic mirror 2803; an optical system 2807; a display device 2808; a phase differentiating plate 2809; and a projection optical system 2810. The projection optical system 2810 comprises a plurality of optical lenses having a projection lens. Though the present embodiment shows an example of 3-plate type in which 3 display devices 2808 are used, this is not to limit to this example and a single plate type may be used for instance. Further, an operator may appropriately dispose an optical lens, a film which has a function to polarize light, a film which adjusts a phase difference and an IR film, etc in the optical path shown by an arrow in FIG. 23C.

Figure 23D:
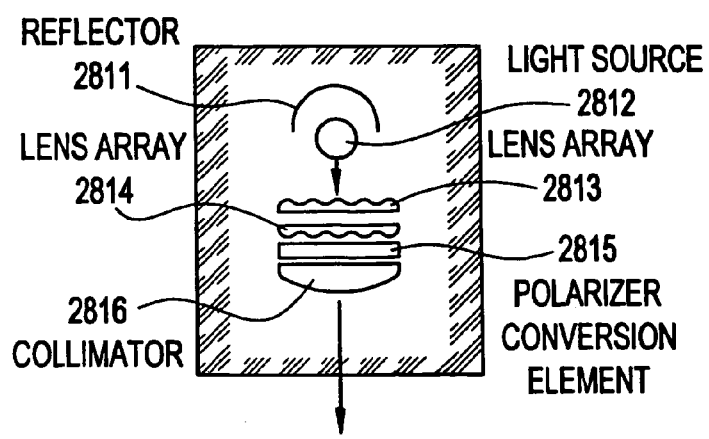

FIG. 23D is a diagram showing an example of a structure of the optical light source system 2801 of FIG. 23C. In the present embodiment the optical light source system 2801 comprises: a reflector 2811; a light source 2812; lens arrays 2813 and 2814; a polarizer conversion element 2815; and a collimator 2816. Note that the optical light source system shown in FIG. 23D is merely an example and the structure is not limited to this example. For instance, an operator may appropriately dispose an optical lens, a film which has a function to polarize light, a film which adjusts a phase difference and an IR film, etc.

Though FIGS. 23A to 23D show an example of 3-plate type projector, they may be single plate type. In such cases, color display may be performed by forming a color filter onto the liquid crystal panel.

A high field effect mobility TFT can be manufactured with the present invention because a semiconductor film having amorphous portions is crystallized using a metallic element, and because a film having extremely superior crystallinity can be formed. Further, the metallic element used in crystallization is gettered, and therefore the reliability and the stability of the TFT are superior. Furthermore, element integration becomes easy because the regions for gettering the metallic element are contained in n-type and p-type impurity regions which function as a source and a drain. In addition, by prescribing the concentration profile of phosphorous or antimony in the gettering region, recrystallization can reliably occur, and therefore this is connected to increased yield.

What is claimed is:

1. A semiconductor device comprising:
a semiconductor film on an insulating surface, the semiconductor film comprising an n-type impurity region containing a periodic table group 15 element, wherein a concentration of the periodic table group 15 element varies in a gradient from the insulating surface,
a channel forming region, and
a gate electrode adjacent to the channel forming region,
wherein the n-type impurity region contains a metallic element for promoting crystallization of silicon,
wherein a thickness of a first region of the n-type impurity region where a first concentration of the periodic table group 15 element is $1 \times 10^{20}$ atoms/cm$^3$ or less is 5 nm or greater,
wherein the maximum value of a second concentration of the periodic table group 15 element in a second region of the n-type impurity region is $1 \times 10^{20}$ atoms/cm$^3$ or more,
wherein the first region is on the insulating surface, and
wherein the second region is over the first region.

2. The semiconductor device according to claim 1, wherein the first concentration of the group 15 element in the first region monotonically decreases toward the insulating surface.

3. The semiconductor device according to claim 1, wherein a concentration of the metallic element in the channel forming region is lower than a concentration of the metallic element in the n-type impurity region.

4. The semiconductor device according to claim 1, wherein the group 15 element is one selected from the group consisting of phosphorus and antimony.

5. The semiconductor device according to claim 1, wherein the metallic element is one element or plural kinds of elements selected from the group consisting of Ni, Fe, Co, Ru, Rh, Pd, Os, Ir, Pt, Cu, and Au.

6. The semiconductor device according to claim 1, wherein said semiconductor device is an active matrix liquid crystal display device.

7. The semiconductor device according to claim 1, wherein said semiconductor device is an active matrix electro-luminescence display device.

8. The semiconductor device according to claim 1, wherein said semiconductor device is selected from the group consisting of personal computer, a video camera, a mobile computer, a goggle type display, a DVD player, a digital camera, and a projector.

9. A semiconductor device comprising:
a semiconductor film on an insulating surface, the semiconductor film comprising an n-type impurity region containing a periodic table group 15 element, wherein a concentration of the periodic table group 15 element varies in a gradient from the insulating surface,
a channel forming region, and
a gate electrode adjacent to the channel forming region,
wherein the n-type impurity region contains a metallic element for promoting crystallization of silicon, wherein a thickness of a first region of the n-type impurity region where a first concentration of the periodic table group 15 element is $5\times10^{19}$ atoms/cm$^3$ or less is 5 nm or greater, wherein the maximum value of a second concentration of the periodic table group 15 element in a second region of the n-type impurity region is $5\times10^{19}$ atoms/cm$^3$ or more, and wherein the first region is on the insulating surface, and wherein the second region is over the first region.

10. The semiconductor device according to claim 9, wherein the first concentration of the group 15 element in the first region monotonically decreases toward the insulating surface.

11. The semiconductor device according to claim 9, wherein a concentration of the metallic element in the channel forming region is lower than a concentration of the metallic element in the n-type impurity region.

12. The semiconductor device according to claim 9, wherein the group 15 element is one selected from the group consisting of phosphorus and antimony.

13. The semiconductor device according to claim 9, wherein the metallic element is one element or plural kinds of elements selected from the group consisting of Ni, Fe, Co, Ru, Rh, Pd, Os, Ir, Pt, Cu, and Au.

14. The semiconductor device according to claim 9, wherein said semiconductor device is an active matrix liquid crystal display device.

15. The semiconductor device according to claim 9, wherein said semiconductor device is an active matrix electro-luminescence display device.

16. The semiconductor device according to claim 9, wherein said semiconductor device is selected from the group consisting of personal computer, a video camera, a mobile computer, a goggle type display, a DVD player, a digital camera, and a projector.

17. A semiconductor device comprising:

a semiconductor film on an insulating surface, the semiconductor film comprising an n-type impurity region containing a periodic table group 15 element, wherein a concentration of the periodic table group 15 element varies in a gradient from the insulating surface, a channel forming region, and a gate electrode adjacent to the channel forming region, wherein the n-type impurity region contains a metallic element for promoting crystallization of silicon, wherein a thickness of a first region of the n-type impurity region where a first concentration of the periodic table group 15 element is $5\times10^{19}$ atoms/cm$^3$ or less is 5 nm or greater, wherein the maximum value of a second concentration of the periodic table group 15 element in a second region of the n-type impurity region is $1\times10^{20}$ atoms/cm$^3$ or more, and wherein the first region is on the insulating surface, and wherein the second region is over the first region.

18. The semiconductor device according to claim 17, wherein the first concentration of the group 15 element in the first region monotonically decreases toward the insulating surface.

19. The semiconductor device according to claim 17, wherein a concentration of the metallic element in the channel forming region is lower than a concentration of the metallic element in the n-type impurity region.

20. The semiconductor device according to claim 17, wherein the group 15 element is one selected from the group consisting of phosphorus and antimony.

21. The semiconductor device according to claim 17, wherein the metallic element is one element or plural kinds of elements selected from the group consisting of Ni, Fe, Co, Ru, Rh, Pd, Os, Ir, Pt, Cu, and Au.

22. The semiconductor device according to claim 17, wherein said semiconductor device is an active matrix liquid crystal display device.

23. The semiconductor device according to claim 17, wherein said semiconductor device is an active matrix electro-luminescence display device.

24. The semiconductor device according to claim 17, wherein said semiconductor device is selected from the group consisting of personal computer, a video camera, a mobile computer, a goggle type display, a DVD player, a digital camera, and a projector.

* * * * *